United States Patent
Bertness (10) Patent No.: US 9,018,958 B2
(45) Date of Patent: Apr. 28, 2015

(54) METHOD AND APPARATUS FOR MEASURING A PARAMETER OF A VEHICLE ELECTRICAL SYSTEM

(75) Inventor: Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 380 days.

(21) Appl. No.: 13/276,639

(22) Filed: Oct. 19, 2011

(65) Prior Publication Data
US 2012/0035870 A1 Feb. 9, 2012

Related U.S. Application Data

(60) Continuation-in-part of application No. 11/641,594, filed on Dec. 19, 2006, which is a division of application No. 10/656,526, filed on Sep. 5, 2003, now Pat. No. 7,154,276.

(51) Int. Cl.
*G01R 31/00* (2006.01)
*G01R 27/16* (2006.01)
*G01R 31/02* (2006.01)

(52) U.S. Cl.
CPC .............. *G01R 31/006* (2013.01); *G01R 27/16* (2013.01); *G01R 31/021* (2013.01)

(58) Field of Classification Search
CPC ........... G01R 31/2889; G01R 31/2884; G01R 31/026; G01R 31/2601; G01R 31/3025; G01R 31/006; G01R 31/007; G01R 31/025; G01R 27/02; G01R 27/16; G01L 1/205; H01R 2201/20; B60R 25/24; G01M 17/00; G06F 17/5045

USPC ......... 324/500, 503, 522, 525, 715, 718, 691, 324/754.01–765.01
See application file for complete search history.

(56) References Cited

U.S. PATENT DOCUMENTS

| | | | |
|---|---|---|---|
| 85,553 A | 1/1869 | Adams | 33/472 |
| 2,000,665 A | 5/1935 | Neal | 439/440 |
| 2,417,940 A | 3/1947 | Lehman | 200/61.25 |
| 2,437,772 A | 3/1948 | Wall | 324/523 |
| 2,514,745 A | 7/1950 | Dalzell | 324/115 |
| 2,727,221 A | 12/1955 | Springg | 340/447 |

(Continued)

FOREIGN PATENT DOCUMENTS

| | | |
|---|---|---|
| CN | 2470964 Y | 1/2002 |
| CN | 201063352 Y | 5/2008 |

(Continued)

OTHER PUBLICATIONS

"Electrochemical Impedance Spectroscopy in Battery Development and Testing", *Batteries International*, Apr. 1997, pp. 59 and 62-63.

(Continued)

*Primary Examiner* — Patrick Assouad
*Assistant Examiner* — Sean Curtis
(74) *Attorney, Agent, or Firm* — Westman, Champlin & Koehler, P.A.

(57) ABSTRACT

An apparatus for measuring electrical parameters for an electrical system measures a first and second parameters of the electrical system between connections to the electrical system. A processor determines a third electrical parameter of the electrical system as a function of the first parameter and the second parameter. Wireless communication is provided between components of the apparatus.

39 Claims, 4 Drawing Sheets

(56) References Cited

U.S. PATENT DOCUMENTS

| | | | |
|---|---|---|---|
| 3,178,686 A | 4/1965 | Mills | 340/447 |
| 3,223,969 A | 12/1965 | Alexander | 340/447 |
| 3,267,452 A | 8/1966 | Wolf | 340/249 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,699,433 A | 10/1972 | Smith, Jr. | 324/523 |
| 3,729,989 A | 5/1973 | Little | 73/862.192 |
| 3,750,011 A | 7/1973 | Kreps | 324/430 |
| 3,753,094 A | 8/1973 | Furuishi et al. | 324/430 |
| 3,776,177 A | 12/1973 | Bryant et al. | 116/311 |
| 3,796,124 A | 3/1974 | Crosa | 411/521 |
| 3,808,522 A | 4/1974 | Sharaf | 324/430 |
| 3,811,089 A | 5/1974 | Strzelewicz | 324/170 |
| 3,816,805 A | 6/1974 | Terry | 320/123 |
| 3,850,490 A | 11/1974 | Zehr | 439/822 |
| 3,857,082 A | 12/1974 | Van Opijnen | 320/143 |
| 3,873,911 A | 3/1975 | Champlin | 324/430 |
| 3,876,931 A | 4/1975 | Godshalk | 324/429 |
| 3,886,426 A | 5/1975 | Daggett | 320/117 |
| 3,886,443 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |
| 3,920,284 A | 11/1975 | Lane et al. | 303/122.06 |
| 3,936,744 A | 2/1976 | Perlmutter | 324/772 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 3,997,830 A | 12/1976 | Newell et al. | 320/102 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,057,313 A | 11/1977 | Polizzano | 439/219 |
| 4,070,624 A | 1/1978 | Taylor | 324/772 |
| 4,086,531 A | 4/1978 | Bernier | 324/772 |
| 4,106,025 A | 8/1978 | Katz | 343/715 |
| 4,112,351 A | 9/1978 | Back et al. | 324/380 |
| 4,114,083 A | 9/1978 | Benham et al. | 340/636.13 |
| 4,126,874 A | 11/1978 | Suzuki et al. | 396/301 |
| 4,160,916 A | 7/1979 | Papasideris | 307/10.6 |
| 4,178,546 A | 12/1979 | Hulls et al. | 324/772 |
| 4,193,025 A | 3/1980 | Frailing et al. | 324/427 |
| 4,207,610 A | 6/1980 | Gordon | 701/33.9 |
| 4,207,611 A | 6/1980 | Gordon | 701/33 |
| 4,217,645 A | 8/1980 | Barry et al. | 702/63 |
| 4,218,745 A | 8/1980 | Perkins | 324/66 |
| 4,280,457 A | 7/1981 | Bloxham | 123/198 R |
| 4,297,639 A | 10/1981 | Branham | 324/429 |
| 4,307,342 A | 12/1981 | Peterson | 324/767 |
| 4,315,204 A | 2/1982 | Sievers et al. | 322/28 |
| 4,316,185 A | 2/1982 | Watrous et al. | 340/636.11 |
| 4,322,685 A | 3/1982 | Frailing et al. | 324/429 |
| 4,351,405 A | 9/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,425,791 A * | 1/1984 | Kling | 73/116.02 |
| 4,441,359 A | 4/1984 | Ezoe | 73/116.06 |
| 4,459,548 A | 7/1984 | Lentz et al. | 324/472 |
| 4,514,694 A | 4/1985 | Finger | 324/429 |
| 4,520,353 A | 5/1985 | McAuliffe | 340/636.16 |
| 4,521,498 A | 6/1985 | Juergens | 429/59 |
| 4,564,798 A | 1/1986 | Young | 320/103 |
| 4,620,767 A | 11/1986 | Woolf | 439/217 |
| 4,633,418 A | 12/1986 | Bishop | 702/63 |
| 4,637,359 A | 1/1987 | Cook | 123/179 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,773,011 A | 9/1988 | VanHoose | 701/30 |
| 4,781,629 A | 11/1988 | Mize | 439/822 |
| D299,909 S | 2/1989 | Casey | D10/77 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,885,523 A | 12/1989 | Koenck | 230/131 |
| 4,888,716 A | 12/1989 | Ueno | 702/63 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,965,738 A | 10/1990 | Bauer et al. | 320/136 |
| 4,968,941 A | 11/1990 | Rogers | 324/428 |
| 4,968,942 A | 11/1990 | Palanisamy | 324/430 |
| 4,969,834 A | 11/1990 | Johnson | 439/141 |
| 4,983,086 A | 1/1991 | Hatrock | 411/259 |
| 5,004,979 A | 4/1991 | Marino et al. | 324/160 |
| 5,030,916 A | 7/1991 | Bokitch | 324/503 |
| 5,032,825 A | 7/1991 | Kuznicki | 340/636.15 |
| 5,034,893 A | 7/1991 | Fisher | 701/99 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |

(56) References Cited

U.S. PATENT DOCUMENTS

| | | | |
|---|---|---|---|
| 5,144,248 A | 9/1992 | Alexandres et al. | 324/428 |
| D330,338 S | 10/1992 | Wang | D10/77 |
| 5,159,272 A | 10/1992 | Rao et al. | 324/429 |
| 5,160,881 A | 11/1992 | Schramm et al. | 322/7 |
| 5,164,653 A | 11/1992 | Reem | |
| 5,168,208 A | 12/1992 | Schultz et al. | 322/25 |
| 5,170,124 A | 12/1992 | Blair et al. | 324/434 |
| 5,179,335 A | 1/1993 | Nor | 320/159 |
| 5,187,382 A | 2/1993 | Kondo | 307/10.1 |
| 5,194,799 A | 3/1993 | Tomantschger | 320/103 |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,278,759 A | 1/1994 | Berra et al. | 701/1 |
| 5,281,919 A | 1/1994 | Palanisamy | 324/427 |
| 5,281,920 A | 1/1994 | Wurst | 324/430 |
| 5,295,078 A | 3/1994 | Stich et al. | 700/297 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,313,152 A | 5/1994 | Wozniak et al. | 320/118 |
| 5,315,287 A | 5/1994 | Sol | 340/455 |
| 5,321,626 A | 6/1994 | Palladino | 702/63 |
| 5,321,627 A | 6/1994 | Reher | 702/63 |
| 5,323,337 A | 6/1994 | Wilson et al. | 702/73 |
| 5,325,041 A | 6/1994 | Briggs | 320/149 |
| 5,331,268 A | 7/1994 | Patino et al. | 320/158 |
| 5,332,927 A | 7/1994 | Paul et al. | 307/66 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,345,384 A | 9/1994 | Przybyla et al. | 701/29.1 |
| 5,347,163 A | 9/1994 | Yoshimura | 307/66 |
| 5,352,968 A | 10/1994 | Reni et al. | 320/136 |
| 5,357,519 A | 10/1994 | Martin et al. | 371/15.1 |
| 5,365,160 A | 11/1994 | Leppo et al. | 320/136 |
| 5,365,453 A | 11/1994 | Startup et al. | 702/36 |
| 5,369,364 A | 11/1994 | Renirie et al. | 324/430 |
| 5,381,096 A | 1/1995 | Hirzel | 324/427 |
| 5,384,540 A | 1/1995 | Dessel | 324/539 |
| 5,387,871 A | 2/1995 | Tsai | 324/429 |
| 5,394,093 A | 2/1995 | Cervas | 324/556 |
| 5,402,007 A | 3/1995 | Center et al. | 290/40 B |
| 5,410,754 A | 4/1995 | Klotzbach et al. | 370/466 |
| 5,412,308 A | 5/1995 | Brown | 323/267 |
| 5,412,323 A | 5/1995 | Kato et al. | 324/429 |
| 5,425,041 A | 6/1995 | Seko et al. | 372/45.01 |
| 5,426,371 A | 6/1995 | Salley et al. | 324/429 |
| 5,426,416 A | 6/1995 | Jefferies et al. | 340/664 |
| 5,430,645 A | 7/1995 | Keller | 364/424.01 |
| 5,432,025 A | 7/1995 | Cox | 429/65 |
| 5,432,426 A | 7/1995 | Yoshida | 320/160 |
| 5,434,495 A | 7/1995 | Toko | 320/135 |
| 5,435,185 A | 7/1995 | Eagan | 73/587 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,453,027 A | 9/1995 | Buell et al. | 439/433 |
| 5,457,377 A | 10/1995 | Jonsson | 324/430 |
| 5,459,660 A | 10/1995 | Berra | 701/33 |
| 5,469,043 A | 11/1995 | Cherng et al. | 320/161 |
| 5,485,090 A | 1/1996 | Stephens | 324/433 |
| 5,488,300 A | 1/1996 | Jamieson | 324/432 |
| 5,504,674 A | 4/1996 | Chen et al. | 705/4 |
| 5,508,599 A | 4/1996 | Koenck | 320/138 |
| 5,519,383 A | 5/1996 | De La Rosa | 340/636.15 |
| 5,528,148 A | 6/1996 | Rogers | 320/137 |
| 5,537,967 A | 7/1996 | Tashiro et al. | 123/192.1 |
| 5,541,489 A | 7/1996 | Dunstan | 320/134 |
| 5,546,317 A | 8/1996 | Andrieu | 702/63 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/128 |
| 5,572,136 A | 11/1996 | Champlin | 324/426 |
| 5,573,611 A | 11/1996 | Koch et al. | 152/152.1 |
| 5,574,355 A | 11/1996 | McShane et al. | 320/161 |
| 5,578,915 A | 11/1996 | Crouch, Jr. et al. | 324/428 |
| 5,583,416 A | 12/1996 | Klang | 320/160 |
| 5,585,416 A | 12/1996 | Audett et al. | 522/35 |
| 5,585,728 A | 12/1996 | Champlin | 324/427 |
| 5,589,757 A | 12/1996 | Klang | 320/160 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/135 |
| 5,596,261 A | 1/1997 | Suyama | 320/152 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,614,788 A | 3/1997 | Mullins et al. | 315/82 |
| 5,621,298 A | 4/1997 | Harvey | 320/134 |
| 5,631,536 A | 5/1997 | Tseng | 320/15 |
| 5,631,831 A | 5/1997 | Bird et al. | 701/34.4 |
| 5,633,985 A | 5/1997 | Severson et al. | 704/267 |
| 5,637,978 A | 6/1997 | Kellett et al. | 320/104 |
| 5,642,031 A | 6/1997 | Brotto | 320/156 |
| 5,644,212 A | 7/1997 | Takahashi | 320/134 |
| 5,650,937 A | 7/1997 | Bounaga | 702/65 |
| 5,652,501 A | 7/1997 | McClure et al. | 340/636.15 |
| 5,653,659 A | 8/1997 | Kunibe et al. | 477/111 |
| 5,654,623 A | 8/1997 | Shiga et al. | 320/106 |
| 5,656,920 A | 8/1997 | Cherng et al. | 324/431 |
| 5,661,368 A | 8/1997 | Deol et al. | 315/82 |
| 5,666,040 A | 9/1997 | Bourbeau | 320/118 |
| 5,675,234 A | 10/1997 | Greene | 340/636.11 |
| 5,677,077 A | 10/1997 | Faulk | 429/90 |
| 5,684,678 A | 11/1997 | Barrett | 363/17 |
| 5,691,621 A | 11/1997 | Phuoc et al. | 320/134 |
| 5,699,050 A | 12/1997 | Kanazawa | 340/636.13 |
| 5,701,089 A | 12/1997 | Perkins | 324/772 |
| 5,705,929 A | 1/1998 | Caravello et al. | 324/430 |
| 5,707,015 A | 1/1998 | Guthrie | 241/120 |
| 5,710,503 A | 1/1998 | Sideris et al. | 320/116 |
| 5,711,648 A | 1/1998 | Hammerslag | 414/800 |
| 5,712,795 A | 1/1998 | Layman et al. | 700/297 |
| 5,717,336 A | 2/1998 | Basell et al. | 324/430 |
| 5,717,937 A | 2/1998 | Fritz | 713/300 |
| 5,721,688 A | 2/1998 | Bramwell | 324/426 |
| 5,732,074 A | 3/1998 | Spaur et al. | 370/313 |
| 5,739,667 A | 4/1998 | Matsuda et al. | 320/128 |
| 5,744,962 A | 4/1998 | Alber et al. | 324/426 |
| 5,745,044 A | 4/1998 | Hyatt, Jr. et al. | 340/5.23 |
| 5,747,189 A | 5/1998 | Perkins | 429/91 |
| 5,747,909 A | 5/1998 | Syverson et al. | 310/156.56 |
| 5,747,967 A | 5/1998 | Muljadi et al. | 320/148 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,772,468 A | 6/1998 | Kowalski et al. | 439/506 |
| 5,773,962 A | 6/1998 | Nor | 20/134 |
| 5,773,978 A | 6/1998 | Becker | 324/430 |
| 5,778,326 A | 7/1998 | Moroto et al. | 701/22 |
| 5,780,974 A | 7/1998 | Pabla et al. | 315/82 |
| 5,780,980 A | 7/1998 | Naito | 318/139 |
| 5,789,899 A | 8/1998 | van Phuoc et al. | 320/112 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/434 |
| 5,811,979 A | 9/1998 | Rhein | 324/718 |
| 5,818,201 A | 10/1998 | Stockstad et al. | 320/119 |
| 5,818,234 A | 10/1998 | McKinnon | 324/433 |
| 5,820,407 A | 10/1998 | Morse et al. | 439/504 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,831,435 A | 11/1998 | Troy | 324/426 |
| 5,832,396 A | 11/1998 | Moroto et al. | 701/22 |

(56) References Cited

U.S. PATENT DOCUMENTS

| | | | |
|---|---|---|---|
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,869,951 A | 2/1999 | Takahashi | 320/104 |
| 5,871,858 A | 2/1999 | Thomsen et al. | 429/7 |
| 5,872,443 A | 2/1999 | Williamson | 320/160 |
| 5,872,453 A | 2/1999 | Shimoyama et al. | 324/431 |
| 5,883,306 A | 3/1999 | Hwang | 73/146.8 |
| 5,884,202 A * | 3/1999 | Arjomand | 701/31.4 |
| 5,895,440 A | 4/1999 | Proctor et al. | 702/63 |
| 5,903,154 A | 5/1999 | Zhang et al. | 324/437 |
| 5,903,716 A | 5/1999 | Kimber et al. | 395/114 |
| 5,912,534 A | 6/1999 | Benedict | 315/82 |
| 5,914,605 A | 6/1999 | Bertness | 324/430 |
| 5,916,287 A * | 6/1999 | Arjomand et al. | 701/33.2 |
| 5,927,938 A | 7/1999 | Hammerslag | 414/809 |
| 5,929,609 A | 7/1999 | Joy et al. | 322/25 |
| 5,935,180 A | 8/1999 | Fieramosca et al. | 701/29.6 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/430 |
| 5,946,605 A | 8/1999 | Takahisa et al. | 455/68 |
| 5,950,144 A | 9/1999 | Hall et al. | 702/108 |
| 5,951,229 A | 9/1999 | Hammerslag | 414/398 |
| 5,953,322 A | 9/1999 | Kimball | 370/328 |
| 5,955,951 A | 9/1999 | Wischerop et al. | 340/572.8 |
| 5,961,561 A | 10/1999 | Wakefield, II | 701/29 |
| 5,961,604 A | 10/1999 | Anderson et al. | 709/229 |
| 5,963,012 A | 10/1999 | Garcia et al. | 320/106 |
| 5,969,625 A | 10/1999 | Russo | 340/636.19 |
| 5,973,598 A | 10/1999 | Beigel | 340/572.1 |
| 5,978,805 A | 11/1999 | Carson | 707/10 |
| 5,982,138 A | 11/1999 | Krieger | 320/105 |
| 5,990,664 A | 11/1999 | Rahman | 320/136 |
| 6,002,238 A | 12/1999 | Champlin | 320/134 |
| 6,005,489 A | 12/1999 | Siegle et al. | 340/825.69 |
| 6,005,759 A | 12/1999 | Hart et al. | 361/66 |
| 6,008,652 A | 12/1999 | Theofanopoulos et al. | 324/434 |
| 6,009,369 A | 12/1999 | Boisvert et al. | 701/99 |
| 6,016,047 A | 1/2000 | Notten et al. | 320/137 |
| 6,031,354 A | 2/2000 | Wiley et al. | 320/116 |
| 6,031,368 A | 2/2000 | Klippel et al. | 324/133 |
| 6,037,745 A | 3/2000 | Koike et al. | 320/104 |
| 6,037,749 A | 3/2000 | Parsonage | 320/132 |
| 6,037,751 A | 3/2000 | Klang | 320/160 |
| 6,037,777 A | 3/2000 | Champlin | 324/430 |
| 6,037,778 A | 3/2000 | Makhija | 324/433 |
| 6,046,514 A | 4/2000 | Rouillard et al. | 307/77 |
| 6,051,976 A | 4/2000 | Bertness | 324/426 |
| 6,055,468 A | 4/2000 | Kaman et al. | 701/29 |
| 6,061,638 A | 5/2000 | Joyce | 702/63 |
| 6,064,372 A | 5/2000 | Kahkoska | 345/173 |
| 6,072,299 A | 6/2000 | Kurle et al. | 320/112 |
| 6,072,300 A | 6/2000 | Tsuji | 320/116 |
| 6,075,339 A | 6/2000 | Reipur et al. | 320/110 |
| 6,081,098 A | 6/2000 | Bertness et al. | 320/134 |
| 6,081,109 A | 6/2000 | Seymour et al. | 324/127 |
| 6,087,815 A | 7/2000 | Pfeifer et al. | 323/282 |
| 6,091,238 A | 7/2000 | McDermott | 324/207.2 |
| 6,091,245 A | 7/2000 | Bertness | 324/426 |
| 6,094,033 A | 7/2000 | Ding et al. | 320/132 |
| 6,097,193 A | 8/2000 | Bramwell | 324/429 |
| 6,100,670 A | 8/2000 | Levesque | 320/150 |
| 6,100,815 A | 8/2000 | Pailthorp | 324/754.7 |
| 6,104,167 A | 8/2000 | Bertness et al. | 320/132 |
| 6,113,262 A | 9/2000 | Purola et al. | 374/45 |
| 6,114,834 A | 9/2000 | Parise | 320/109 |
| 6,121,880 A | 9/2000 | Scott et al. | 340/572.5 |
| 6,136,914 A | 10/2000 | Hergenrother et al. | 524/495 |
| 6,137,269 A | 10/2000 | Champlin | 320/150 |
| 6,140,797 A | 10/2000 | Dunn | 320/105 |
| 6,141,608 A | 10/2000 | Rother | 701/29.6 |
| 6,144,185 A | 11/2000 | Dougherty et al. | 320/132 |
| 6,147,598 A | 11/2000 | Murphy et al. | 340/426.19 |
| 6,150,793 A | 11/2000 | Lesesky et al. | 320/104 |
| 6,158,000 A | 12/2000 | Collins | 713/1 |
| 6,161,640 A | 12/2000 | Yamaguchi | 180/65.8 |
| 6,163,156 A | 12/2000 | Bertness | 324/426 |
| 6,164,063 A | 12/2000 | Mendler | 60/274 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,177,737 B1 | 1/2001 | Palfey et al. | 307/64 |
| 6,181,545 B1 | 1/2001 | Amatucci et al. | 361/502 |
| 6,184,656 B1 | 2/2001 | Karunasiri et al. | 320/119 |
| 6,191,557 B1 | 2/2001 | Gray et al. | 320/132 |
| 6,202,739 B1 | 3/2001 | Pal et al. | 165/104.33 |
| 6,211,651 B1 | 4/2001 | Nemoto | 320/133 |
| 6,215,275 B1 | 4/2001 | Bean | 320/106 |
| 6,218,805 B1 | 4/2001 | Melcher | 320/105 |
| 6,218,936 B1 | 4/2001 | Imao | 340/447 |
| 6,222,342 B1 | 4/2001 | Eggert et al. | 320/105 |
| 6,222,369 B1 | 4/2001 | Champlin | 324/430 |
| D442,503 S | 5/2001 | Lundbeck et al. | D10/77 |
| 6,225,808 B1 | 5/2001 | Varghese et al. | 324/426 |
| 6,225,898 B1 | 5/2001 | Kamiya et al. | 340/505 |
| 6,236,186 B1 | 5/2001 | Helton et al. | 320/106 |
| 6,236,332 B1 | 5/2001 | Conkright et al. | 340/3.1 |
| 6,236,949 B1 | 5/2001 | Hart | 702/64 |
| 6,238,253 B1 | 5/2001 | Qualls | 439/759 |
| 6,242,887 B1 | 6/2001 | Burke | 320/104 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,259,170 B1 | 7/2001 | Limoge et al. | 307/10.8 |
| 6,259,254 B1 | 7/2001 | Klang | 324/427 |
| 6,262,563 B1 | 7/2001 | Champlin | 320/134 |
| 6,262,692 B1 | 7/2001 | Babb | 343/895 |
| 6,263,268 B1 | 7/2001 | Nathanson | 701/29 |
| 6,263,322 B1 | 7/2001 | Kirkevold et al. | 705/400 |
| 6,271,643 B1 | 8/2001 | Becker et al. | 320/112 |
| 6,271,748 B1 | 8/2001 | Derbyshire et al. | 340/442 |
| 6,272,387 B1 | 8/2001 | Yoon | 700/83 |
| 6,275,008 B1 | 8/2001 | Arai et al. | 320/132 |
| 6,285,191 B1 | 9/2001 | Gollomp et al. | 324/427 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertness | 324/430 |
| 6,313,607 B1 | 11/2001 | Champlin | 320/132 |
| 6,313,608 B1 | 11/2001 | Varghese et al. | 320/132 |
| 6,316,914 B1 * | 11/2001 | Bertness | 320/112 |
| 6,320,351 B1 | 11/2001 | Ng et al. | 320/104 |
| 6,323,650 B1 * | 11/2001 | Bertness et al. | 324/426 |
| 6,324,042 B1 | 11/2001 | Andrews | 361/93.2 |
| 6,329,793 B1 | 12/2001 | Bertness et al. | 320/132 |
| 6,331,762 B1 * | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,356,042 B1 | 3/2002 | Kahlon et al. | 318/138 |
| 6,356,083 B1 | 3/2002 | Ying | 324/426 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| RE37,677 E | 4/2002 | Irie | 315/83 |
| 6,377,031 B1 | 4/2002 | Karuppana et al. | 323/220 |
| 6,384,608 B1 | 5/2002 | Namaky | 324/430 |
| 6,388,448 B1 | 5/2002 | Cervas | 324/426 |
| 6,389,337 B1 | 5/2002 | Kolls | 701/31.6 |
| 6,392,414 B2 | 5/2002 | Bertness | 324/429 |
| 6,396,278 B1 | 5/2002 | Makhija | 324/402 |
| 6,407,554 B1 | 6/2002 | Godau et al. | 324/503 |
| 6,411,098 B1 | 6/2002 | Laletin | 324/436 |
| 6,417,669 B1 | 7/2002 | Champlin | 324/426 |
| 6,420,852 B1 | 7/2002 | Sato | 320/134 |
| 6,424,157 B1 | 7/2002 | Gollomp et al. | 324/430 |
| 6,424,158 B2 | 7/2002 | Klang | 324/433 |
| 6,437,957 B1 | 8/2002 | Karuppana et al. | 361/78 |
| 6,441,585 B1 | 8/2002 | Bertness | 320/132 |
| 6,445,158 B1 | 9/2002 | Bertness et al. | 320/104 |
| 6,448,778 B1 | 9/2002 | Rankin | 324/503 |

(56) References Cited

U.S. PATENT DOCUMENTS

| | | | |
|---|---|---|---|
| 6,449,726 B1 | 9/2002 | Smith | 713/340 |
| 6,456,036 B1 | 9/2002 | Thandiwe | 320/106 |
| 6,456,045 B1* | 9/2002 | Troy et al. | 320/139 |
| 6,465,908 B1 | 10/2002 | Karuppana et al. | 307/31 |
| 6,466,025 B1 | 10/2002 | Klang | 324/429 |
| 6,466,026 B1 | 10/2002 | Champlin | 324/430 |
| 6,469,511 B1 | 10/2002 | Vonderhaar et al. | 324/425 |
| 6,473,659 B1 | 10/2002 | Shah et al. | 700/79 |
| 6,477,478 B1 | 11/2002 | Jones et al. | 702/102 |
| 6,495,990 B2 | 12/2002 | Champlin | 320/132 |
| 6,497,209 B1 | 12/2002 | Karuppana et al. | 123/179.3 |
| 6,500,025 B1 | 12/2002 | Moenkhaus et al. | 439/502 |
| 6,505,507 B1 | 1/2003 | Imao | 73/146.5 |
| 6,507,196 B2 | 1/2003 | Thomsen et al. | 324/436 |
| 6,526,361 B1 | 2/2003 | Jones et al. | 702/63 |
| 6,529,723 B1 | 3/2003 | Bentley | 455/405 |
| 6,531,848 B1 | 3/2003 | Chitsazan et al. | 320/153 |
| 6,532,425 B1 | 3/2003 | Boost et al. | 702/63 |
| 6,533,316 B2* | 3/2003 | Breed et al. | 280/735 |
| 6,534,992 B2 | 3/2003 | Meissner et al. | 324/426 |
| 6,534,993 B2 | 3/2003 | Bertness | 324/433 |
| 6,536,536 B1 | 3/2003 | Gass et al. | 173/2 |
| 6,544,078 B2* | 4/2003 | Palmisano et al. | 439/762 |
| 6,545,599 B2 | 4/2003 | Derbyshire et al. | 340/442 |
| 6,556,019 B2 | 4/2003 | Bertness | 324/426 |
| 6,566,883 B1 | 5/2003 | Vonderhaar et al. | 324/426 |
| 6,570,385 B1 | 5/2003 | Roberts et al. | 324/378 |
| 6,577,107 B2 | 6/2003 | Kechmire | 320/139 |
| 6,586,941 B2 | 7/2003 | Bertness et al. | 324/426 |
| 6,597,150 B1 | 7/2003 | Bertness et al. | 320/104 |
| 6,599,243 B2 | 7/2003 | Woltermann et al. | 600/300 |
| 6,600,815 B1 | 7/2003 | Walding | 379/93.07 |
| 6,611,740 B2 | 8/2003 | Lowrey et al. | 701/29 |
| 6,614,349 B1 | 9/2003 | Proctor et al. | 340/572.1 |
| 6,618,644 B2 | 9/2003 | Bean | 700/231 |
| 6,621,272 B2 | 9/2003 | Champlin | 324/426 |
| 6,623,314 B1 | 9/2003 | Cox et al. | 439/759 |
| 6,624,635 B1 | 9/2003 | Lui | 324/426 |
| 6,628,011 B2 | 9/2003 | Droppo et al. | 307/43 |
| 6,629,054 B2 | 9/2003 | Makhija et al. | 702/113 |
| 6,633,165 B2 | 10/2003 | Bertness | 324/426 |
| 6,635,974 B1 | 10/2003 | Karuppana et al. | 307/140 |
| 6,636,790 B1 | 10/2003 | Lightner et al. | 701/31.5 |
| 6,667,624 B1* | 12/2003 | Raichle et al. | 324/522 |
| 6,679,212 B2 | 1/2004 | Kelling | 123/179.28 |
| 6,686,542 B2 | 2/2004 | Zhang | 174/74 |
| 6,696,819 B2 | 2/2004 | Bertness | 320/134 |
| 6,707,303 B2 | 3/2004 | Bertness et al. | 324/426 |
| 6,732,031 B1 | 5/2004 | Lightner et al. | 701/31.4 |
| 6,736,941 B2 | 5/2004 | Oku et al. | 203/68 |
| 6,737,831 B2 | 5/2004 | Champlin | 320/132 |
| 6,738,697 B2 | 5/2004 | Breed | 701/29 |
| 6,740,990 B2 | 5/2004 | Tozuka et al. | 307/9.1 |
| 6,744,149 B1 | 6/2004 | Karuppana et al. | 307/31 |
| 6,745,153 B2 | 6/2004 | White et al. | 702/184 |
| 6,759,849 B2 | 7/2004 | Bertness et al. | 324/426 |
| 6,771,073 B2* | 8/2004 | Henningson et al. | 324/426 |
| 6,777,945 B2 | 8/2004 | Roberts et al. | 324/426 |
| 6,781,344 B1 | 8/2004 | Hedegor et al. | 320/106 |
| 6,781,382 B2 | 8/2004 | Johnson | 324/426 |
| 6,784,635 B2 | 8/2004 | Larson | 320/104 |
| 6,784,637 B2 | 8/2004 | Raichle et al. | 320/107 |
| 6,788,025 B2 | 9/2004 | Bertness et al. | 320/104 |
| 6,795,782 B2* | 9/2004 | Bertness et al. | 702/63 |
| 6,796,841 B1 | 9/2004 | Cheng et al. | 439/620.3 |
| 6,805,090 B2 | 10/2004 | Bertness et al. | 123/198 |
| 6,806,716 B2 | 10/2004 | Bertness et al. | 324/426 |
| 6,825,669 B2 | 11/2004 | Raichle et al. | 324/426 |
| 6,832,141 B2 | 12/2004 | Skeen et al. | 701/31.4 |
| 6,842,707 B2 | 1/2005 | Raichle et al. | 702/62 |
| 6,845,279 B1 | 1/2005 | Gilmore et al. | 700/115 |
| 6,850,037 B2 | 2/2005 | Bertness | 320/132 |
| 6,856,162 B1 | 2/2005 | Greatorex et al. | 324/764.01 |
| 6,856,972 B1 | 2/2005 | Yun et al. | 705/36 R |
| 6,871,151 B2 | 3/2005 | Bertness | 702/63 |
| 6,885,195 B2 | 4/2005 | Bertness | 324/426 |
| 6,888,468 B2 | 5/2005 | Bertness | 340/636.15 |
| 6,891,378 B2 | 5/2005 | Bertness et al. | 324/426 |
| 6,904,796 B2 | 6/2005 | Pacsai et al. | 73/146.8 |
| 6,906,522 B2 | 6/2005 | Bertness et al. | 324/426 |
| 6,906,523 B2 | 6/2005 | Bertness et al. | 324/426 |
| 6,906,624 B2 | 6/2005 | McClelland et al. | 340/442 |
| 6,909,287 B2 | 6/2005 | Bertness | 324/427 |
| 6,909,356 B2 | 6/2005 | Brown et al. | 340/3.2 |
| 6,911,825 B2* | 6/2005 | Namaky | 324/426 |
| 6,913,483 B2 | 7/2005 | Restaino et al. | 439/504 |
| 6,914,413 B2 | 7/2005 | Bertness et al. | 320/104 |
| 6,919,725 B2 | 7/2005 | Bertness et al. | 324/433 |
| 6,930,485 B2 | 8/2005 | Bertness et al. | 324/426 |
| 6,933,727 B2 | 8/2005 | Bertness et al. | 324/426 |
| 6,941,234 B2 | 9/2005 | Bertness et al. | 702/63 |
| 6,957,133 B1 | 10/2005 | Hunt et al. | 701/32.4 |
| 6,967,484 B2 | 11/2005 | Bertness | 324/426 |
| 6,972,662 B1 | 12/2005 | Ohkawa et al. | 340/10.1 |
| 6,983,212 B2 | 1/2006 | Burns | 702/63 |
| 6,993,421 B2 | 1/2006 | Pillar et al. | 701/29.4 |
| 6,998,847 B2 | 2/2006 | Bertness et al. | 324/426 |
| 7,003,410 B2 | 2/2006 | Bertness et al. | 702/63 |
| 7,003,411 B2 | 2/2006 | Bertness | 702/63 |
| 7,012,433 B2* | 3/2006 | Smith et al. | 324/426 |
| 7,015,674 B2 | 3/2006 | VonderHaar | 320/103 |
| 7,029,338 B1 | 4/2006 | Orange et al. | 439/755 |
| 7,034,541 B2 | 4/2006 | Bertness et al. | 324/426 |
| 7,039,533 B2 | 5/2006 | Bertness et al. | 702/63 |
| 7,042,346 B2 | 5/2006 | Paulsen | 340/438 |
| 7,058,525 B2 | 6/2006 | Bertness et al. | 702/63 |
| 7,081,755 B2 | 7/2006 | Klang et al. | 324/426 |
| 7,089,127 B2 | 8/2006 | Thibedeau et al. | 702/63 |
| 7,098,666 B2 | 8/2006 | Patino | 324/433 |
| 7,102,556 B2 | 9/2006 | White | 341/141 |
| 7,106,070 B2 | 9/2006 | Bertness et al. | 324/538 |
| 7,116,109 B2 | 10/2006 | Klang | 324/426 |
| 7,119,686 B2 | 10/2006 | Bertness et al. | 340/572.1 |
| 7,120,488 B2 | 10/2006 | Nova et al. | 600/2 |
| 7,126,341 B2 | 10/2006 | Bertness et al. | 324/426 |
| 7,129,706 B2 | 10/2006 | Kalley | 324/426 |
| 7,154,276 B2* | 12/2006 | Bertness | 324/503 |
| 7,170,393 B2 | 1/2007 | Martin | 340/10.1 |
| 7,177,925 B2 | 2/2007 | Carcido et al. | 709/223 |
| 7,182,147 B2 | 2/2007 | Cutler et al. | 173/1 |
| 7,184,905 B2 | 2/2007 | Stefan | 702/63 |
| 7,198,510 B2 | 4/2007 | Bertness | 439/500 |
| 7,200,424 B2 | 4/2007 | Tischer et al. | 455/567 |
| 7,202,636 B2 | 4/2007 | Reynolds et al. | 320/166 |
| 7,208,914 B2 | 4/2007 | Klang | 320/132 |
| 7,209,850 B2 | 4/2007 | Brott et al. | 324/426 |
| 7,209,860 B2 | 4/2007 | Trsar et al. | 702/183 |
| 7,212,887 B2 | 5/2007 | Shah et al | 700/276 |
| 7,219,023 B2 | 5/2007 | Banke et al. | 702/58 |
| 7,233,128 B2 | 6/2007 | Brost et al. | 320/132 |
| 7,235,977 B2 | 6/2007 | Koran et al. | 324/426 |
| 7,246,015 B2 | 7/2007 | Bertness et al. | 702/63 |
| 7,272,519 B2 | 9/2007 | Lesesky et al. | 702/63 |
| 7,287,001 B1 | 10/2007 | Falls et al. | 705/22 |
| 7,295,936 B2 | 11/2007 | Bertness et al. | 702/63 |
| 7,319,304 B2 | 1/2008 | Veloo et al. | 320/134 |
| 7,339,477 B2 | 3/2008 | Puzio et al. | 340/572.1 |
| 7,363,175 B2 | 4/2008 | Bertness et al. | 702/63 |
| 7,398,176 B2 | 7/2008 | Bertness | 702/140 |
| 7,408,358 B2 | 8/2008 | Knopf | 324/426 |
| 7,425,833 B2 | 9/2008 | Bertness et al. | 324/426 |
| 7,446,536 B2 | 11/2008 | Bertness | 324/426 |
| 7,453,238 B2 | 11/2008 | Melichar | 320/132 |
| 7,479,763 B2 | 1/2009 | Bertness | 320/134 |
| 7,498,767 B2 | 3/2009 | Brown et al. | 320/107 |
| 7,501,795 B2 | 3/2009 | Bertness et al. | 320/136 |
| 7,505,856 B2 | 3/2009 | Restaino et al. | 702/63 |
| 7,545,146 B2 | 6/2009 | Klang et al. | 324/426 |
| 7,557,586 B1 | 7/2009 | Vonderhaar et al. | 324/437 |
| 7,590,476 B2 | 9/2009 | Shumate | 701/31.6 |
| 7,592,776 B2 | 9/2009 | Tsukamoto et al. | 320/136 |
| 7,595,643 B2 | 9/2009 | Klang | 324/426 |
| 7,598,699 B2 | 10/2009 | Restaino et al. | 320/105 |
| 7,598,743 B2 | 10/2009 | Bertness | 324/426 |

(56) References Cited

U.S. PATENT DOCUMENTS

| | | |
|---|---|---|
| 7,598,744 B2 | 10/2009 | Bertness et al. .............. 324/426 |
| 7,619,417 B2 | 11/2009 | Klang ............................ 324/427 |
| 7,642,786 B2 | 1/2010 | Philbrook ..................... 324/426 |
| 7,642,787 B2 | 1/2010 | Bertness et al. .............. 324/426 |
| 7,656,162 B2 | 2/2010 | Vonderhaar et al. ......... 324/426 |
| 7,657,386 B2 | 2/2010 | Thibedeau et al. ............. 702/63 |
| 7,667,437 B2 | 2/2010 | Johnson et al. ............... 320/150 |
| 7,679,325 B2 | 3/2010 | Seo ................................. 20/116 |
| 7,684,908 B1 | 3/2010 | Ogilvie et al. ............... 701/29.6 |
| 7,688,074 B2 | 3/2010 | Cox et al. ...................... 324/426 |
| 7,698,179 B2 | 4/2010 | Leung et al. ..................... 705/28 |
| 7,705,602 B2 | 4/2010 | Bertness ........................ 324/426 |
| 7,706,991 B2 | 4/2010 | Bertness et al. ................. 702/63 |
| 7,710,119 B2 | 5/2010 | Bertness ........................ 324/426 |
| 7,723,993 B2 | 5/2010 | Klang ............................ 324/431 |
| 7,728,556 B2 | 6/2010 | Yano et al. .................... 320/134 |
| 7,728,597 B2 | 6/2010 | Bertness ........................ 324/426 |
| 7,751,953 B2 | 7/2010 | Namaky ....................... 701/33.2 |
| 7,772,850 B2 | 8/2010 | Bertness ........................ 324/426 |
| 7,774,151 B2 | 8/2010 | Bertness .......................... 702/63 |
| 7,777,612 B2 | 8/2010 | Sampson et al. ........... 340/426.1 |
| 7,791,348 B2 | 9/2010 | Brown et al. ................. 324/426 |
| 7,808,375 B2 | 10/2010 | Bertness et al. .............. 340/455 |
| 7,848,857 B2 | 12/2010 | Nasr et al. ....................... 701/22 |
| 7,883,002 B2 | 2/2011 | Jin et al. ........................ 235/376 |
| 7,902,990 B2 | 3/2011 | Delmonico et al. ........ 340/636.1 |
| 7,924,015 B2 | 4/2011 | Bertness ........................ 324/427 |
| 7,940,053 B2 | 5/2011 | Brown et al. ................. 324/426 |
| 7,999,505 B2 | 8/2011 | Bertness ........................ 320/104 |
| 8,164,343 B2 | 4/2012 | Bertness ........................ 324/503 |
| 8,306,690 B2 | 11/2012 | Bertness ....................... 701/34.4 |
| 2001/0035737 A1 | 11/2001 | Nakanishi et al. ............ 320/122 |
| 2001/0048215 A1* | 12/2001 | Breed et al. .................. 280/728.1 |
| 2002/0004694 A1 | 1/2002 | McLeod ......................... 701/29 |
| 2002/0007237 A1 | 1/2002 | Phung et al. .................... 701/33 |
| 2002/0010558 A1 | 1/2002 | Bertness et al. ................. 702/63 |
| 2002/0021135 A1 | 2/2002 | Li et al. ......................... 324/677 |
| 2002/0027346 A1* | 3/2002 | Breed et al. .................. 280/735 |
| 2002/0030495 A1 | 3/2002 | Kechmire .................... 324/427 |
| 2002/0036504 A1* | 3/2002 | Troy et al. .................... 324/430 |
| 2002/0041175 A1 | 4/2002 | Lauper et al. ................. 320/106 |
| 2002/0044050 A1 | 4/2002 | Derbyshire et al. ........... 340/442 |
| 2002/0047711 A1* | 4/2002 | Bertness et al. .............. 324/426 |
| 2002/0050163 A1 | 5/2002 | Makhija et al. ................. 73/116 |
| 2002/0074398 A1 | 6/2002 | Lancos et al. ................. 235/382 |
| 2002/0118111 A1 | 8/2002 | Brown et al. ............... 340/573.1 |
| 2002/0121901 A1 | 9/2002 | Hoffman ....................... 324/426 |
| 2002/0128985 A1 | 9/2002 | Greenwald .................... 705/400 |
| 2002/0171428 A1 | 11/2002 | Bertness ......................... 702/63 |
| 2002/0176010 A1 | 11/2002 | Wallach et al. ............... 348/362 |
| 2003/0006779 A1 | 1/2003 | H. Youval ..................... 324/503 |
| 2003/0009270 A1 | 1/2003 | Breed ............................ 701/29 |
| 2003/0017753 A1* | 1/2003 | Palmisano et al. ............ 439/762 |
| 2003/0025481 A1 | 2/2003 | Bertness ....................... 324/427 |
| 2003/0036909 A1 | 2/2003 | Kato ............................. 704/275 |
| 2003/0040873 A1 | 2/2003 | Lesesky et al. ................. 702/57 |
| 2003/0060953 A1 | 3/2003 | Chen ............................. 701/33 |
| 2003/0078743 A1 | 4/2003 | Bertness et al. ................. 702/63 |
| 2003/0088375 A1 | 5/2003 | Bertness et al. ................. 702/63 |
| 2003/0124417 A1 | 7/2003 | Bertness et al. ............... 429/90 |
| 2003/0128036 A1 | 7/2003 | Henningson et al. ......... 324/426 |
| 2003/0137277 A1 | 7/2003 | Mori et al. .................... 320/132 |
| 2003/0169018 A1 | 9/2003 | Berels et al. .................. 320/132 |
| 2003/0169019 A1 | 9/2003 | Oosaki ......................... 320/132 |
| 2003/0171111 A1 | 9/2003 | Clark ......................... 455/414.1 |
| 2003/0177417 A1 | 9/2003 | Malhotra et al. ............... 714/42 |
| 2003/0184262 A1 | 10/2003 | Makhija ........................ 320/156 |
| 2003/0184306 A1 | 10/2003 | Bertness et al. .............. 324/426 |
| 2003/0187556 A1 | 10/2003 | Suzuki ............................ 701/29 |
| 2003/0194672 A1 | 10/2003 | Roberts et al. ................ 431/196 |
| 2003/0197512 A1 | 10/2003 | Miller et al. ................... 324/426 |
| 2003/0212311 A1 | 11/2003 | Nova et al. .................... 600/300 |
| 2003/0214395 A1 | 11/2003 | Flowerday et al. ........... 340/445 |
| 2004/0000590 A1 | 1/2004 | Raichle et al. ............ 235/462.01 |
| 2004/0000891 A1 | 1/2004 | Raichle et al. ................ 320/107 |
| 2004/0000893 A1 | 1/2004 | Raichle et al. ................ 320/135 |
| 2004/0000913 A1 | 1/2004 | Raichle et al. ................ 324/426 |
| 2004/0000915 A1 | 1/2004 | Raichle et al. ................ 324/522 |
| 2004/0002824 A1 | 1/2004 | Raichle et al. ................. 702/63 |
| 2004/0002825 A1 | 1/2004 | Raichle et al. ................. 702/63 |
| 2004/0002836 A1 | 1/2004 | Raichle et al. ............... 702/188 |
| 2004/0032264 A1 | 2/2004 | Schoch ......................... 324/426 |
| 2004/0036443 A1 | 2/2004 | Bertness ....................... 320/109 |
| 2004/0044452 A1 | 3/2004 | Bauer et al. ..................... 703/33 |
| 2004/0044454 A1 | 3/2004 | Ross et al. ....................... 701/33 |
| 2004/0049361 A1 | 3/2004 | Hamdan et al. .............. 702/115 |
| 2004/0051533 A1 | 3/2004 | Namaky ........................ 324/426 |
| 2004/0051534 A1 | 3/2004 | Kobayashi et al. ........... 324/429 |
| 2004/0054503 A1 | 3/2004 | Namaky ........................ 702/182 |
| 2004/0064225 A1 | 4/2004 | Jammu et al. .................. 701/29 |
| 2004/0088087 A1 | 5/2004 | Fukushima et al. ............ 701/32 |
| 2004/0113588 A1 | 6/2004 | Mikuriya et al. ............. 320/128 |
| 2004/0145342 A1 | 7/2004 | Lyon ............................. 320/108 |
| 2004/0164706 A1 | 8/2004 | Osborne ....................... 320/116 |
| 2004/0172177 A1 | 9/2004 | Nagai et al. .................... 701/29 |
| 2004/0178185 A1 | 9/2004 | Yoshikawa et al. .......... 219/270 |
| 2004/0189309 A1* | 9/2004 | Bertness et al. .............. 324/426 |
| 2004/0199343 A1 | 10/2004 | Cardinal et al. ................. 702/63 |
| 2004/0207367 A1 | 10/2004 | Taniguchi et al. ............ 320/149 |
| 2004/0227523 A1 | 11/2004 | Namaky ....................... 324/537 |
| 2004/0239332 A1 | 12/2004 | Mackel et al. ................ 324/426 |
| 2004/0251876 A1 | 12/2004 | Bertness ....................... 320/136 |
| 2005/0007068 A1 | 1/2005 | Johnson et al. ............... 320/110 |
| 2005/0017726 A1 | 1/2005 | Koran et al. ................... 324/433 |
| 2005/0021294 A1 | 1/2005 | Trsar et al. .................... 702/183 |
| 2005/0025299 A1 | 2/2005 | Tischer et al. ................. 379/199 |
| 2005/0043868 A1 | 2/2005 | Mitcham ........................ 701/29 |
| 2005/0057256 A1 | 3/2005 | Bertness ....................... 324/426 |
| 2005/0060070 A1 | 3/2005 | Kapolka et al. ................ 701/29 |
| 2005/0073314 A1 | 4/2005 | Bertness et al. .............. 324/433 |
| 2005/0076381 A1 | 4/2005 | Gross ............................ 725/107 |
| 2005/0096809 A1 | 5/2005 | Skeen et al. .................... 701/29 |
| 2005/0102073 A1 | 5/2005 | Ingram ........................... 701/29 |
| 2005/0128083 A1 | 6/2005 | Puzio et al. ................. 340/572.1 |
| 2005/0128902 A1 | 6/2005 | Tsai ........................... 369/44.32 |
| 2005/0143882 A1 | 6/2005 | Umezawa ....................... 701/29 |
| 2005/0159847 A1 | 7/2005 | Shah et al. .................... 700/276 |
| 2005/0162172 A1 | 7/2005 | Bertness ....................... 324/426 |
| 2005/0168226 A1 | 8/2005 | Quint et al. ................... 324/426 |
| 2005/0173142 A1 | 8/2005 | Cutler et al. .................. 173/181 |
| 2005/0182536 A1 | 8/2005 | Doyle et al. .................... 701/29 |
| 2005/0212521 A1 | 9/2005 | Bertness ....................... 324/426 |
| 2005/0218902 A1 | 10/2005 | Restaino et al. .............. 324/433 |
| 2005/0231205 A1 | 10/2005 | Bertness et al. .............. 324/426 |
| 2005/0254106 A9 | 11/2005 | Silverbrook et al. ......... 358/539 |
| 2005/0256617 A1 | 11/2005 | Cawthorne et al. ............ 701/22 |
| 2005/0258241 A1 | 11/2005 | McNutt et al. ................ 235/385 |
| 2006/0012330 A1 | 1/2006 | Okumura et al. ............. 320/103 |
| 2006/0030980 A1 | 2/2006 | St. Denis ....................... 701/29 |
| 2006/0089767 A1 | 4/2006 | Sowa ............................. 701/29 |
| 2006/0095230 A1 | 5/2006 | Grier et al. ................... 702/183 |
| 2006/0152224 A1 | 7/2006 | Kim et al. ..................... 324/430 |
| 2006/0161313 A1 | 7/2006 | Rogers et al. .................... 701/1 |
| 2006/0161390 A1 | 7/2006 | Namaky et al. .............. 702/183 |
| 2006/0217914 A1 | 9/2006 | Bertness ....................... 702/113 |
| 2006/0282323 A1 | 12/2006 | Walker et al. .................. 705/14 |
| 2007/0024460 A1 | 2/2007 | Clark ............................ 340/663 |
| 2007/0026916 A1 | 2/2007 | Juds et al. ......................... 463/1 |
| 2007/0046261 A1 | 3/2007 | Porebski ....................... 320/132 |
| 2007/0088472 A1 | 4/2007 | Ganzhorn et al. .............. 701/33 |
| 2007/0159177 A1 | 7/2007 | Bertness et al. .............. 324/426 |
| 2007/0182576 A1 | 8/2007 | Proska et al. .............. 340/636.1 |
| 2007/0194791 A1 | 8/2007 | Huang .......................... 324/430 |
| 2007/0194793 A1 | 8/2007 | Bertness ....................... 324/503 |
| 2007/0259256 A1 | 11/2007 | Le Canut et al. ............... 429/90 |
| 2008/0036421 A1 | 2/2008 | Seo et al. ...................... 320/132 |
| 2008/0059014 A1 | 3/2008 | Nasr et al. ....................... 701/22 |
| 2008/0086246 A1 | 4/2008 | Bolt et al. ....................... 701/29 |
| 2008/0094068 A1 | 4/2008 | Scott ............................ 324/426 |
| 2008/0169818 A1 | 7/2008 | Lesesky et al. ............... 324/426 |
| 2008/0303528 A1 | 12/2008 | Kim .............................. 324/430 |
| 2008/0303529 A1 | 12/2008 | Nakamura et al. ........... 324/433 |
| 2008/0315830 A1 | 12/2008 | Bertness ....................... 320/104 |
| 2009/0006476 A1 | 1/2009 | Andreasen et al. ........ 707/104.1 |

(56) References Cited

U.S. PATENT DOCUMENTS

| | | | |
|---|---|---|---|
| 2009/0024266 A1 | 1/2009 | Bertness | 701/22 |
| 2009/0085571 A1 | 4/2009 | Bertness | 324/426 |
| 2009/0146800 A1 | 6/2009 | Grimlund et al. | 340/505 |
| 2009/0198372 A1 | 8/2009 | Hammerslag | 700/226 |
| 2009/0247020 A1 | 10/2009 | Gathman et al. | 439/759 |
| 2009/0276115 A1 | 11/2009 | Chen | 701/32 |
| 2010/0023198 A1 | 1/2010 | Hamilton | 701/29 |
| 2010/0145780 A1 | 6/2010 | Nishikawa et al. | 705/14.11 |
| 2010/0314950 A1 | 12/2010 | Rutkowski et al. | 307/125 |
| 2011/0004427 A1 | 1/2011 | Gorbold et al. | 702/63 |
| 2011/0273181 A1 | 11/2011 | Park et al. | 324/429 |
| 2012/0046824 A1 | 2/2012 | Ruther et al. | 701/31.5 |
| 2013/0158782 A1 | 6/2013 | Bertness et al. | 701/34.4 |

FOREIGN PATENT DOCUMENTS

| | | |
|---|---|---|
| DE | 29 26 716 B1 | 1/1981 |
| DE | 196 38 324 | 9/1996 |
| DE | 10 2008 036 595 A1 | 2/2010 |
| EP | 0 022 450 A1 | 1/1981 |
| EP | 0 391 694 A2 | 4/1990 |
| EP | 0 476 405 A1 | 9/1991 |
| EP | 0 637 754 A1 | 2/1995 |
| EP | 0 772 056 A1 | 5/1997 |
| EP | 0 982 159 A2 | 3/2000 |
| EP | 1 810 869 A1 | 11/2004 |
| EP | 1 807 710 B1 | 7/2007 |
| EP | 1 807 710 | 1/2010 |
| FR | 2 749 397 | 12/1997 |
| GB | 2 029 586 | 3/1980 |
| GB | 2 088 159 A | 6/1982 |
| GB | 2 246 916 A | 10/1990 |
| GB | 2 275 783 A | 7/1994 |
| GB | 2 387 235 A | 10/2003 |
| JP | 59-17892 | 1/1984 |
| JP | 59-17893 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 05211724 A | 8/1993 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| JP | 11-150809 | 6/1999 |
| JP | 2001057711 A | 2/2001 |
| JP | 2003-346909 | 12/2003 |
| JP | 2006331976 A | 12/2006 |
| JP | 2009-244166 | 10/2009 |
| RU | 2089015 C | 8/1997 |
| WO | WO 93/22666 | 11/1993 |
| WO | WO 94/05069 | 3/1994 |
| WO | WO 96/01456 | 1/1996 |
| WO | WO 96/06747 | 3/1996 |
| WO | WO 96/28846 | 9/1996 |
| WO | WO 97/01103 | 1/1997 |
| WO | WO 97/44652 | 11/1997 |
| WO | WO 98/04910 | 2/1998 |
| WO | WO 98/21132 | 5/1998 |
| WO | WO 98/58270 | 12/1998 |
| WO | WO 99/23738 | 5/1999 |
| WO | WO 99/56121 | 11/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |
| WO | WO 03/047064 A3 | 6/2003 |
| WO | WO 03/076960 A1 | 9/2003 |
| WO | WO 2004/047215 A1 | 6/2004 |
| WO | 2010/007681 | 1/2010 |

OTHER PUBLICATIONS

"Battery Impedance", by E. Willihnganz et al., *Electrical Engineering*, Sep. 1959, pp. 922-925.

"Determining the End of Battery Life", by S. DeBardelaben, *IEEE*, 1986, pp. 365-368.

"A Look at the Impedance of a Cell", by S. Debardelaben, *IEEE*, 1988, pp. 394-397.

"The Impedance of Electrical Storage Cells", by N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Spectroscopy Estimates of Bulk, Reaction Rate, and Diffusion Parameters", by J. Macdonald et al., *J. Electroanal, Chem.*, 1991, pp. 1-11.

Internal Resistance: Harbinger of Capacity Loss in Starved Electrolyte Sealed Lead Acid Batteries, by Vaccaro, F.J. et al., AT&T Bell Laboratories, 1987 IEEE, Ch. 2477, pp. 128, 131.

"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.

IEEE Recommended Practice for Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987.

"Performance of Dry Cells", by C. Hambuechen, Preprint of *Am. Electrochem. Soc.*, Apr. 18-20, 1912, paper No. 19, pp. 1-5.

"A Bridge for Measuring Storage Battery Resistance", by E. Willihncanz, *The Electrochemical Society*, preprint 79-20, Apr. 1941, pp. 253-258.

"JIS Japanese Industrial Standard-Lead Acid Batteries for Automobiles", *Japanese Standards Association UDC*, 621.355.2.629.113. 006, Nov. 1995.

National Semiconductor Corporation, "High Q Notch Filter", Mar. 1969, Linear Brief 5.

Burr-Brown Corporation, "Design a 60 Hz Notch Filter with the UAF42", Jan. 1994, AB-071, 1994.

National Semiconductor Corporation, "LMF90-$4^{th}$ -Order Elliptic Notch Filter", Dec. 1994, RRD-B30M115.

"Alligator Clips with Wire Penetrators" *J.S. Popper, Inc.* product information, downloaded from http://www.jspopper.com/, prior to Oct. 1, 2002.

"#12: LM78S40 Simple Switcher DC to DC Converter", *ITM e-Catalog*, downloaded from http://www.pcbcafe.com, prior to Oct. 1, 2002.

"Simple DC-DC Converts Allows Use of Single Battery", *Electronix Express*, downloaded from http://www.elexp.com/t_dc-dc.htm, prior to Oct. 1, 2002.

"DC-DC Converter Basics", *Power Designers*, downloaded from http://www.powederdesigners.com/InforWeb.design_center/articles/DC-DC/converter.shtm , prior to Oct. 1, 2002.

"Notification of Transmittal of the International Search Report or the Declaration", PCT/US02/29461, filed Sep. 17, 2002 and mailed Jan. 3, 2003.

"Notification of Transmittal of the International Search Report or the Declaration", PCT/US03/07546, filed Mar. 13, 2003 and mailed Jul. 4, 2001.

"Notification of Transmittal of the International Search Report or the Declaration", PCT/US03/06577, filed Mar. 5, 2003 and mailed Jul. 24, 2003.

"Notification of Transmittal of the International Search Report or the Declaration", PCT/US03/07837, filed Mar. 14, 2003 and mailed Jul. 4, 2003.

(56) References Cited

OTHER PUBLICATIONS

"Improved Impedance Spectroscopy Technique for Status Determination of Production Li/SO$_2$ Batteries" Terrill Atwater et al., pp. 10-113, (1992).
"Notification of Transmittal of the International Search Report or the Declaration", PCT/US03/41561; Search Report completed Apr. 13, 2004, mailed May 6, 2004.
"Notification of Transmittal of the International Search Report or the Declaration", PCT/US03/27696, filed Sep. 4, 2003 and mailed Apr. 15, 2004.
"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois pp. 1-1-14-13, (1991).
Supplementary European Search Report Communication for Appl. No. 99917402.2; Sep. 7, 2004.
"Dynamic modelling of lead/acid batteries using impedance spectroscopy for parameter identification", Journal of Power Sources, pp. 69-84, (1997).
"Results of Discrete Frequency Immittance Spectroscopy (DFIS) Measurements of Lead Acid Batteries", by K.S. Champlin et al., *Proceedings of 23$^{rd}$ International Teleco Conference (INTELEC)*, published Oct. 2001, IEE, pp. 433-440.
"Examination Report" from the UK Patent Office for App. No. 0417678.0; Jan. 24, 2005.
Notification of Transmittal of the International Search Report for PCT/US03/30707, filed Sep. 30, 2003 and mailed Nov. 24, 2004.
"A review of impedance measurements for determination of the state-of-charge or state-of-health of secondary batteries", Journal of Power Sources, pp. 59-69, (1998).
"Search Report Under Section 17" for Great Britain Application No. GB0421447.4, date of search Jan. 27, 2005, date of document Jan. 28, 2005.
Wikipedia Online Encyclopedia, Inductance, 2005, http://en.wikipedia.org/wiki/inductance, pp. 1-5, mutual Inductance, pp. 3,4.
"Professional BCS System Analyzer Battery-Charger-Starting", pp. 2-8, (2001).
Young Illustrated Encyclopedia Dictionary of Electronics, 1981, Parker Publishing Company, Inc., pp. 318-319.
"DSP Applications in Hybrid Electric Vehicle Powertrain", Miller et al., Proceedings of the American Control Conference, Sand Diego, CA, Jun. 1999; 2 ppg.
"Notification of Transmittal of the International Search Report and the Written Opinion of the International Searching Authority, or the Declaration" for PCT/US2008/008702 filed Jul. 2008; 15 pages.
"A Microprocessor-Based Control System for a Near-Term Electric Vehicle", Bimal K. Bose; IEEE Transactions on Industry Applications, vol. IA-17, No. 6, Nov./Dec. 1981; 0093-9994/81/1100-0626$00.75 © 1981 IEEE, 6 pages.
Notification of Transmittal of the International Search Report and the Written Opinion of the International Searching Authority, or the Declaration for PCT/US2011/038279 filed May 27, 2011, date of mailing Sep. 16, 2011, 12 pages.
U.S. Appl. No. 60/387,912, filed Jun. 13, 2002 which is related to U.S. Patent No. 7,089,127.
"Conductance Testing Compared to Traditional Methods of Evaluating the Capacity of Valve-Regulated Lead-Acid Batteries and Predicting State-of-Health", by D. Feder et al., May 1992, pp. 1-8; (13 total pgs. ).
"Field and Laboratory Studies to Assess the State of Health of Valve-Regulated Lead Acid Batteries: Part I—Conductance/Capacity Correlation Studies", by D. Feder at al., Oct. 1992, pp. 1-15; (19 total pgs. ).
"Field Application of Conductance Measurements Use to Ascertain Cell/Battery and Inter-Cell Connection State-of-Health in Electric Power Utility Applications", by M. Hlavac et al., Apr. 1993, pp. 1-14; (19 total pgs.).
"Conductance Testing of Standby Batteries in Signaling and Communications Applications for the Purpose of Evaluating Battery State-of-Health", by S. McShane, Apr. 1993, pp. 1-9; (14 total pgs.).
"Condutance Monitoring of Recombination Lead Acid Batteries", by B. Jones, May 1993, pp. 1-6; (11 total pgs.).
"Evaluating the State-of-Health of Lead Acid Flooded and Valve-Regulated Batteries: A Comparison of Conductance Testing vs. Traditional Methods", by M. Hlavac et al., Jun. 1993, pp. 1-15; (20 total pgs.).
"Updated State of Conductance/Capacity Correlation Studies to Determine the State-of-Health of Automotive SLI and Standby Lead Acid Batteries", by D. Feder et al., Sep. 1993, pp. 1-17; (22 total pgs.).
"Field and Laboratory Studies to Access the State-of-Health of Valve-Regulated Lead-Acid Battery Technologies Using Conductance Testing Part II-Further Conductance/Capacity Correlation Studies", by M. Hlavac et al., Sep. 1993, pp. 1-9; (14 total pgs.).
"Field Experience of Testing VRLA Batteries by Measuring Conductance", by M.W. Kniveton, May 1994, pp. 1-4; (9 total pgs.).
"Reducing the Cost of Maintaining VRLA Batteries in Telecom Applications", by M.W. Kniveton, Sep. 1994, pp. 1-5; (10 total pgs.).
"Analysis and Interpretation of Conductance Measurements used to Access the State-of-Health of Valve Regulated Lead Acid Batteries Part III: Analytical Techniques", by M. Hlavac, Nov. 1994, 9 pgs; (13 total pgs.).
"Testing 24 Volt Aircraft Batteries Using Midtronics Conductance Technology", by M. Hlavac et al., Jan. 1995, 9 pgs; (13 total pgs.).
"VRLA Battery Monitoring Using Conductance Technology Part IV: On-Line State-of-Health Monitoring and Thermal Runaway Detection/Prevention", by M. Hlavac et al., Oct. 1995, 9 pgs; (13 total pgs.).
"VRLA Battery Conductance Monitoring Part V: Strategies for VRLA Battery Testing and Monitoring in Telecom Operating Environments", by M. Hlavac et al., Oct. 1996, 9 pgs; (13 total pgs.).
"Midpoint Conductance Technology Used in Telecommunication Stationary Standby Battery Applications Part VI: Considerations for Deployment of Midpoint Conductance in Telecommunications Power Applications", by M. Troy et al., Oct. 1997, 9 pgs; (13 total pgs.).
"Impedance/Conductance Measurements as an Aid to Determining Replacement Strategies", M. Kniveton, Sep. 1998, pp. 297-301; (9 total pgs.).
"A Fundamentally New Approach to Battery Performance Analysis Using DFRA™/DTIS™ Technology", by K. Champlin et al., Sep. 2000, 8 pgs; (12 total pgs.).
"Battery State of Health Monitoring, Combining Conductance Technology With Other Measurement Parameters for Real-Time Battery Performance Analysis", by D. Cox et la., Mar. 2000, 6 pgs; (10 total pgs.).
Search Report and Written Opinion from PCT Application No. PCT/US2011/026608, dated Aug. 29, 2011, 9 pgs.
Office Action for corresponding U.S. Appl. No. 10/656,526, dated Apr. 4, 2005, 8 pages.
Office Action for corresponding U.S. Appl. No. 10/656,526, dated Mar. 10, 2006, 7 pages.
Office Action for corresponding U.S. Appl. No. 10/656,526, dated Sep. 22, 2005, 5 pgs.
Office Action for corresponding U.S. Appl. No. 10/656,526, dated Oct. 5, 2004, 6 pgs.
Office Action for corresponding U.S. Appl. No. 11/641,594, dated Feb. 28, 2008, 7 pgs.
Office Action for corresponding U.S. Appl. No. 11/641,594, dated Mar. 5, 2010, 10 pgs.
Office Action for corresponding U.S. Appl. No. 11/641,594, dated Mar. 10, 2011, 11 pgs.
Office Action for corresponding U.S. Appl. No. 11/641,594, dated May 24, 2010, 8 pgs.
Office Action for corresponding U.S. Appl. No. 11/641,594, dated Jun. 1, 2009, 9 pgs.
Office Action for corresponding U.S. Appl. No. 11/641,594, dated Aug. 25, 2008, 8 pgs.
Office Action for corresponding U.S. Appl. No. 11/641,594, dated Sep. 6, 2011, 13 pgs.

(56) References Cited

OTHER PUBLICATIONS

Office Action for corresponding U.S. Appl. No. 11/641,594, dated Sep. 15, 2009, 9 pgs.
Office Action for corresponding U.S. Appl. No. 11/641,594, dated Oct. 29, 2010, 11 pgs.
Office Action for corresponding U.S. Appl. No. 11/641,594, dated Dec. 11, 2008, 8 pgs.
Communication from GB1216105.5, dated Sep. 21, 2012.
Notification of Transmittal of the International Search Report and Written Opinion from PCT/US2011/039043, dated Jul. 26, 2012.
Notification of Transmittal of the International Search Report and Written Opinion from PCT/US2011/053886, dated Jul. 27, 2012.
"Field Evaluation of Honda's EV PLUS Battery Packs", by A. Paryani, *IEEE AES Systems Magazine*, Nov. 2000, pp. 21-24.
Examination Report under section 18(3) for corresponding Great Britain Application No. GB1000773.0, dated Feb. 6, 2012, 2 pages.
Search Report from PCT/US2011/047354, dated Nov. 11, 2011.
Written Opinion from PCT/US2011/047354, dated Nov. 11, 2011.
First Office Action (Notification of Reasons for Rejections) dated Dec. 3, 2013 in related Japanese patent application No. 2013-513370, 9 pgs. Including English Translation.
Official Action dated Jan. 22, 2014 in related Korean patent application No. 10-2012-7033020, 2 pgs including English Translation.
Office Action from U.S. Appl. No. 11/641,594, dated Mar. 22, 2013.
Office Action from U.S. Appl. No. 11/641,594, dated Dec. 10, 2012.
Office Action from U.S. Appl. No. 11/641,594, dated Mar. 29, 2012.
Official Action dated Feb. 20, 2014 in Korean patent application No. 10-2013-7004814, 6 pgs. including English Translation.
First Office Action for Chinese Patent Application No. 201180011597.4, dated May 6, 2014, 20 pages.
Office Action from Korean Application No. 10/2012-7033020, dated Jul. 29, 2014.
Office Action for Chinese Patent Application No. 201180038844.X, dated Jul. 1, 2014, 11 pages.
Office Action for Chinese Patent Application No. 201180030045.8, dated Jul. 21, 2014, 16 pages.
Office Action for Japanese Patent Application No. 2013-513370, dated Aug. 5, 2014, 9 pages.
Office Action for Japanese Patent Application No. 2013-531839, dated Jul. 8, 2014, 10 pages.

\* cited by examiner

METHOD AND APPARATUS FOR MEASURING A PARAMETER OF A VEHICLE ELECTRICAL SYSTEM

BACKGROUND OF THE INVENTION

The present application is a Continuation-In-Part of application Ser. No. 11/641,594, filed Dec. 19, 2006 which is a Divisional of and claims priority of U.S. patent application Ser. No. 10/656,526, filed Sep. 5, 2003, now U.S. Pat. No. 7,154,276, the contents of which are hereby incorporated by reference in their entirety.

The present invention relates to the measurement of electrical parameters of a vehicle electrical system. More specifically, the present invention relates to measuring an electrical parameter of an electrical system of a vehicle through the use of multiple measurements.

Electrical systems, such as those which are used in automotive vehicles, consist of a number of discreet components or systems which are interconnected. Techniques for measuring and utilizing parameters, such as dynamic parameters, of electrical systems are shown and disclosed in U.S. Pat. No. 3,873,911, issued Mar. 25, 1975, to Champlin; U.S. Pat. No. 3,909,708, issued Sep. 30, 1975, to Champlin; U.S. Pat. No. 4,816,768, issued Mar. 28, 1989, to Champlin; U.S. Pat. No. 4,825,170, issued Apr. 25, 1989, to Champlin; U.S. Pat. No. 4,881,038, issued Nov. 14, 1989, to Champlin; U.S. Pat. No. 4,912,416, issued Mar. 27, 1990, to Champlin; U.S. Pat. No. 5,140,269, issued Aug. 18, 1992, to Champlin; U.S. Pat. No. 5,343,380, issued Aug. 30, 1994; U.S. Pat. No. 5,572,136, issued Nov. 5, 1996; U.S. Pat. No. 5,574,355, issued Nov. 12, 1996; U.S. Pat. No. 5,583,416, issued Dec. 10, 1996; U.S. Pat. No. 5,585,728, issued Dec. 17, 1996; U.S. Pat. No. 5,589,757, issued Dec. 31, 1996; U.S. Pat. No. 5,592,093, issued Jan. 7, 1997; U.S. Pat. No. 5,598,098, issued Jan. 28, 1997; U.S. Pat. No. 5,656,920, issued Aug. 12, 1997; U.S. Pat. No. 5,757,192, issued May 26, 1998; U.S. Pat. No. 5,821,756, issued Oct. 13, 1998; U.S. Pat. No. 5,831,435, issued Nov. 3, 1998; U.S. Pat. No. 5,871,858, issued Feb. 16, 1999; U.S. Pat. No. 5,914,605, issued Jun. 22, 1999; U.S. Pat. No. 5,945,829, issued Aug. 31, 1999; U.S. Pat. No. 6,002,238, issued Dec. 14, 1999; U.S. Pat. No. 6,037,751, issued Mar. 14, 2000; U.S. Pat. No. 6,037,777, issued Mar. 14, 2000; U.S. Pat. No. 6,051,976, issued Apr. 18, 2000; U.S. Pat. No. 6,081,098, issued Jun. 27, 2000; U.S. Pat. No. 6,091,245, issued Jul. 18, 2000; U.S. Pat. No. 6,104,167, issued Aug. 15, 2000; U.S. Pat. No. 6,137,269, issued Oct. 24, 2000; U.S. Pat. No. 6,163,156, issued Dec. 19, 2000; U.S. Pat. No. 6,172,483, issued Jan. 9, 2001; U.S. Pat. No. 6,172,505, issued Jan. 9, 2001; U.S. Pat. No. 6,222,369, issued Apr. 24, 2001; U.S. Pat. No. 6,225,808, issued May 1, 2001; U.S. Pat. No. 6,249,124, issued Jun. 19, 2001; U.S. Pat. No. 6,259,254, issued Jul. 10, 2001; U.S. Pat. No. 6,262,563, issued Jul. 17, 2001; U.S. Pat. No. 6,294,896, issued Sep. 25, 2001; U.S. Pat. No. 6,294,897, issued Sep. 25, 2001; U.S. Pat. No. 6,304,087, issued Oct. 16, 2001; U.S. Pat. No. 6,310,481, issued Oct. 30, 2001; U.S. Pat. No. 6,313,607, issued Nov. 6, 2001; U.S. Pat. No. 6,313,608, issued Nov. 6, 2001; U.S. Pat. No. 6,316,914, issued Nov. 13, 2001; U.S. Pat. No. 6,323,650, issued Nov. 27, 2001; U.S. Pat. No. 6,329,793, issued Dec. 11, 2001; U.S. Pat. No. 6,331,762, issued Dec. 18, 2001; U.S. Pat. No. 6,332,113, issued Dec. 18, 2001; U.S. Pat. No. 6,351,102, issued Feb. 26, 2002; U.S. Pat. No. 6,359,441, issued Mar. 19, 2002; U.S. Pat. No. 6,363,303, issued Mar. 26, 2002; U.S. Pat. No. 6,377,031, issued Apr. 23, 2002; U.S. Pat. No. 6,392,414, issued May 21, 2002; U.S. Pat. No. 6,417,669, issued Jul. 9, 2002; U.S. Pat. No. 6,424,158, issued Jul. 23, 2002; U.S. Pat. No. 6,441,585, issued Aug. 17, 2002; U.S. Pat. No. 6,437,957, issued Aug. 20, 2002; U.S. Pat. No. 6,445,158, issued Sep. 3, 2002; U.S. Pat. Nos. 6,456,045; 6,466,025, issued Oct. 15, 2002; U.S. Pat. No. 6,465,908, issued Oct. 15, 2002; U.S. Pat. No. 6,466,026, issued Oct. 15, 2002; U.S. Pat. No. 6,469,511, issued Nov. 22, 2002; U.S. Pat. No. 6,495,990, issued Dec. 17, 2002; U.S. Pat. No. 6,497,209, issued Dec. 24, 2002; U.S. Pat. No. 6,507,196, issued Jan. 14, 2003; U.S. Pat. No. 6,534,993; issued Mar. 18, 2003; U.S. Pat. No. 6,544,078, issued Apr. 8, 2003; U.S. Pat. No. 6,556,019, issued Apr. 29, 2003; U.S. Pat. No. 6,566,883, issued May 20, 2003; U.S. Pat. No. 6,586,941, issued Jul. 1, 2003; U.S. Pat. No. 6,597,150, issued Jul. 22, 2003; U.S. Pat. No. 6,621,272, issued Sep. 16, 2003; U.S. Pat. No. 6,623,314, issued Sep. 23, 2003; U.S. Pat. No. 6,633,165, issued Oct. 14, 2003; U.S. Pat. No. 6,635,974, issued Oct. 21, 2003; U.S. Pat. No. 6,707,303, issued Mar. 16, 2004; U.S. Pat. No. 6,737,831, issued May 18, 2004; U.S. Pat. No. 6,744,149, issued Jun. 1, 2004; U.S. Pat. No. 6,759,849, issued Jul. 6, 2004; U.S. Pat. No. 6,781,382, issued Aug. 24, 2004; U.S. Pat. No. 6,788,025, filed Sep. 7, 2004; U.S. Pat. No. 6,795,782, issued Sep. 21, 2004; U.S. Pat. No. 6,805,090, filed Oct. 19, 2004; U.S. Pat. No. 6,806,716, filed Oct. 19, 2004; U.S. Pat. No. 6,850,037, filed Feb. 1, 2005; U.S. Pat. No. 6,850,037, issued Feb. 1, 2005; U.S. Pat. No. 6,871,151, issued Mar. 22, 2005; U.S. Pat. No. 6,885,195, issued Apr. 26, 2005; U.S. Pat. No. 6,888,468, issued May 3, 2005; U.S. Pat. No. 6,891,378, issued May 10, 2005; U.S. Pat. No. 6,906,522, issued Jun. 14, 2005; U.S. Pat. No. 6,906,523, issued Jun. 14, 2005; U.S. Pat. No. 6,909,287, issued Jun. 21, 2005; U.S. Pat. No. 6,914,413, issued Jul. 5, 2005; U.S. Pat. No. 6,913,483, issued Jul. 5, 2005; U.S. Pat. No. 6,930,485, issued Aug. 16, 2005; U.S. Pat. No. 6,933,727, issued Aug. 23, 200; U.S. Pat. No. 6,941,234, filed Sep. 6, 2005; U.S. Pat. No. 6,967,484, issued Nov. 22, 2005; U.S. Pat. No. 6,998,847, issued Feb. 14, 2006; U.S. Pat. No. 7,003,410, issued Feb. 21, 2006; U.S. Pat. No. 7,003,411, issued Feb. 21, 2006; U.S. Pat. No. 7,012,433, issued Mar. 14, 2006; U.S. Pat. No. 7,015,674, issued Mar. 21, 2006; U.S. Pat. No. 7,034,541, issued Apr. 25, 2006; U.S. Pat. No. 7,039,533, issued May 2, 2006; U.S. Pat. No. 7,058,525, issued Jun. 6, 2006; U.S. Pat. No. 7,081,755, issued Jul. 25, 2006; U.S. Pat. No. 7,106,070, issued Sep. 12, 2006; U.S. Pat. No. 7,116,109, issued Oct. 3, 2006; U.S. Pat. No. 7,119,686, issued Oct. 10, 2006; and U.S. Pat. No. 7,126,341, issued Oct. 24, 2006; U.S. Pat. No. 7,154,276, issued Dec. 26, 2006; U.S. Pat. No. 7,198,510, issued Apr. 3, 2007; U.S. Pat. No. 7,363,175, issued Apr. 22, 2008; U.S. Pat. No. 7,208,914, issued Apr. 24, 2007; U.S. Pat. No. 7,246,015, issued Jul. 17, 2007; U.S. Pat. No. 7,295,936, issued Nov. 13, 2007; U.S. Pat. No. 7,319,304, issued Jan. 15, 2008; U.S. Pat. No. 7,363,175, issued Apr. 22, 2008; U.S. Pat. No. 7,398,176, issued Jul. 8, 2008; U.S. Pat. No. 7,408,358, issued Aug. 5, 2008; U.S. Pat. No. 7,425,833, issued Sep. 16, 2008; U.S. Pat. No. 7,446,536, issued Nov. 4, 2008; U.S. Pat. No. 7,479,763, issued Jan. 20, 2009; U.S. Pat. No. 7,498,767, issued Mar. 3, 2009; U.S. Pat. No. 7,501,795, issued Mar. 10, 2009; U.S. Pat. No. 7,505,856, issued Mar. 17, 2009; U.S. Pat. No. 7,545,146, issued Jun. 9, 2009; U.S. Pat. No. 7,557,586, issued Jul. 7, 2009; U.S. Pat. No. 7,595,643, issued Sep. 29, 2009; U.S. Pat. No. 7,598,699, issued Oct. 6, 2009; U.S. Pat. No. 7,598,744, issued Oct. 6, 2009; U.S. Pat. No. 7,598,743, issued Oct. 6, 2009; U.S. Pat. No. 7,619,417, issued Nov. 17, 2009; U.S. Pat. No. 7,642,786, issued Jan. 5, 2010; U.S. Pat. No. 7,642,787, issued Jan. 5, 2010; U.S. Pat. No. 7,656,162, issued Feb. 2, 2010; U.S. Pat. No. 7,688,074, issued Mar. 30, 2010; U.S. Pat. No. 7,705,602, issued Apr. 27, 2010; U.S. Pat. No. 7,706,992, issued Apr. 27, 2010; U.S. Pat. No. 7,710,119, issued May 4, 2010; U.S. Pat. No. 7,723,993, issued May 25, 2010; U.S. Pat. No. 7,728,597, issued Jun. 1, 2010; U.S. Pat. No. 7,772,850, issued Aug. 10, 2010; U.S. Pat. No. 7,774,151, issued Aug. 10, 2010; U.S. Pat. No. 7,777,612, issued Aug. 17, 2010; U.S. Pat. No. 7,791,348, issued Sep. 7, 2010; U.S. Pat. No. 7,808,375, issued Oct. 5, 2010; U.S. Pat. No. 7,924,015, issued Apr. 12, 2011; U.S. Pat. No. 7,940,053, issued May 10, 2011; U.S. Pat. No. 7,940,052, issued May 10, 2011; U.S. Pat. No. 7,959,476, issued Jun. 14, 2011; U.S. Pat. No. 7,977,914, issued Jul. 12, 2011; U.S. Pat. No. 7,999,505, issued Aug. 16, 2011; U.S. Pat. No. D643,759, issued Aug. 23, 2011; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 10/042,451, filed Jan. 8, 2002, entitled BATTERY CHARGE CONTROL DEVICE; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,998, filed Mar. 29, 2002, entitled BATTERY TESTER WITH BATTERY REPLACEMENT OUTPUT; U.S. Ser. No. 10/263,473, filed Oct. 2, 2002, entitled ELECTRONIC BATTERY TESTER WITH RELATIVE TEST OUTPUT; U.S. Ser. No. 10/310,385, filed Dec. 5, 2002, entitled BATTERY TEST MODULE; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 10/258,441, filed Apr. 9, 2003, entitled CURRENT MEASURING CIRCUIT SUITED FOR BATTERIES; U.S. Ser. No. 10/681,666, filed Oct. 8, 2003, entitled ELECTRONIC BATTERY TESTER WITH PROBE LIGHT; U.S. Ser. No. 10/791,141, filed Mar. 2, 2004, entitled METHOD AND APPARATUS FOR AUDITING A BATTERY TEST; U.S. Ser. No. 10/867,385, filed Jun. 14, 2004, entitled ENERGY MANAGEMENT SYSTEM FOR AUTOMOTIVE VEHICLE; U.S. Ser. No. 10/958,812, filed Oct. 5, 2004, entitled SCAN TOOL FOR ELECTRONIC BATTERY TESTER; U.S. Ser. No. 60/587,232, filed Dec. 14, 2004, entitled CELLTRON ULTRA, U.S. Ser. No. 60/653,537, filed Feb. 16, 2005, entitled CUSTOMER MANAGED WARRANTY CODE; U.S. Ser. No. 60/665,070, filed Mar. 24, 2005, entitled OHMMETER PROTECTION CIRCUIT; U.S. Ser. No. 60,694,199, filed Jun. 27, 2005, entitled GEL BATTERY CONDUCTANCE COMPENSATION; U.S. Ser. No. 60/705,389, filed Aug. 4, 2005, entitled PORTABLE TOOL THEFT PREVENTION SYSTEM, U.S. Ser. No. 11/207,419, filed Aug. 19, 2005, entitled SYSTEM FOR AUTOMATICALLY GATHERING BATTERY INFORMATION FOR USE DURING BATTERY TESTER/CHARGING, U.S. Ser. No. 60/712,322, filed Aug. 29, 2005, entitled AUTOMOTIVE VEHICLE ELECTRICAL SYSTEM DIAGNOSTIC DEVICE, U.S. Ser. No. 60/713,168, filed Aug. 31, 2005, entitled LOAD TESTER SIMULATION WITH DISCHARGE COMPENSATION, U.S. Ser. No. 60/731,881, filed Oct. 31, 2005, entitled PLUG-IN FEATURES FOR BATTERY TESTERS; U.S. Ser. No. 60/731,887, filed Oct. 31, 2005, entitled AUTOMOTIVE VEHICLE ELECTRICAL SYSTEM DIAGNOSTIC DEVICE; U.S. Ser. No. 11/304,004, filed Dec. 14, 2005, entitled BATTERY TESTER THAT CALCULATES ITS OWN REFERENCE VALUES; U.S. Ser. No. 60/751,853, filed Dec. 20, 2005, entitled BATTERY MONITORING SYSTEM; U.S. Ser. No. 11/304,004, filed Dec. 14, 2005, entitled BATTERY TESTER WITH CALCULATES ITS OWN REFERENCE VALUES; U.S. Ser. No. 60/751,853, filed Dec. 20, 2005, entitled BATTERY MONITORING SYSTEM; U.S. Ser. No. 11/356,443, filed Feb. 16, 2006, entitled ELECTRONIC BATTERY TESTER WITH NETWORK COMMUNICATION; U.S. Ser. No. 11/519,481, filed Sep. 12, 2006, entitled BROAD-BAND LOW-CONDUCTANCE CABLES FOR MAKING KELVIN CONNECTIONS TO ELECTROCHEMICAL CELLS AND BATTERIES; U.S. Ser. No. 60/847,064, filed Sep. 25, 2006, entitled STATIONARY BATTERY MONITORING ALGORITHMS; U.S. Ser. No. 11/641,594, filed Dec. 19, 2006, entitled METHOD AND APPARATUS FOR MEASURING A PARAMETER OF A VEHICLE ELECTRONIC SYSTEM; U.S. Ser. No. 60/950,182, filed Jul. 17, 2007, entitled BATTERY TESTER FOR HYBRID VEHICLE; U.S. Ser. No. 60/973,879, filed Sep. 20, 2007, entitled ELECTRONIC BATTERY TESTER FOR TESTING STATIONARY BATTERIES; U.S. Ser. No. 60/992,798, filed Dec. 6, 2007, entitled STORAGE BATTERY AND BATTERY TESTER; U.S. Ser. No. 61/061,848, filed Jun. 16, 2008, entitled KELVIN CLAMP FOR ELECTRONICALLY COUPLING TO A BATTERY CONTACT; U.S. Ser. No. 12/168,264, filed Jul. 7, 2008, entitled BATTERY TESTERS WITH SECONDARY FUNCTIONALITY; U.S. Ser. No. 12/174,894, filed Jul. 17, 2008, entitled BATTERY TESTER FOR ELECTRIC VEHICLE; U.S. Ser. No. 12/204,141, filed Sep. 4, 2008, entitled ELECTRONIC BATTERY TESTER OR CHARGER WITH DATABUS CONNECTION; U.S. Ser. No. 12/328,022, filed Dec. 4, 2008, entitled STORAGE BATTERY AND BATTERY TESTER; U.S. Ser. No. 12/416,457, filed Apr. 1, 2009, entitled SYSTEM FOR AUTOMATICALLY GATHERING BATTERY INFORMATION; U.S. Ser. No. 12/416,453, filed Apr. 1, 2009, entitled INTEGRATED TAG READER AND ENVIRONMENT SENSOR; U.S. Ser. No. 12/416,445, filed Apr. 1, 2009, entitled SIMPLIFICATION OF INVENTORY MANAGEMENT; U.S. Ser. No. 12/498,642, filed Jul. 7, 2009, entitled ELECTRONIC BATTERY TESTER; U.S. Ser. No. 12/697,485, filed Feb. 1, 2010, entitled ELECTRONIC BATTERY TESTER; U.S. Ser. No. 12/712,456, filed Feb. 25, 2010, entitled METHOD AND APPARATU FOR DETECTING CELL DETERIORATION IN AN ELECTROCHEMICAL CELL OR BATTERY; U.S. Ser. No. 61/311,485, filed Mar. 8, 2010, entitled BATTERY TESTER WITH DATABUS FOR COMMUNICATING WITH VEHICLE ELECTRICAL SYSTEM; U.S. Ser. No. 61/313,893, filed Mar. 15, 2010, entitled USE OF BATTERY MANUFACTURE/SELL DATE IN DIAGNOSIS AND RECOVERY OF DISCHARGED BATTERIES; U.S. Ser. No. 12/758,407, filed Apr. 12, 2010, entitled ELECTRONIC BATTERY TESTER WITH NETWORK COMMUNICATION; U.S. Ser. No. 12/765,323, filed Apr. 22, 2010, entitled AUTOMOTIVE VEHICLE ELECTRICAL SYSTEM DIAGNOSTIC DEVICE; U.S. Ser. No. 12/769,911, filed Apr. 29, 2010, entitled STATIONARY BATTERY TESTER; U.S. Ser. No. 61/330,497, filed May 3, 2010, entitled MAGIC WAND WITH ADVANCED HARNESS DETECTION; U.S. Ser. No. 61/348,901, filed May 27, 2010, entitled ELECTRONIC BATTERY TESTER; U.S. Ser. No. 61/351,017, filed Jun. 3, 2010, entitled IMPROVED ELECTRIC VEHICLE AND HYBRID ELECTRIC VEHICLE BATTERY MODULE BALANCER; U.S. Ser. No. 12/818,290, filed Jun. 18, 2010, entitled BATTERY MAINTENANCE DEVICE WITH THERMAL BUFFER; U.S. Ser. No. 61/373,045, filed Aug. 12, 2010, entitled ELECTRONIC BATTERY TESTER FOR TESTING STATIONERY STORAGE BATTERY; U.S. Ser. No. 12/888,689, filed Sep. 23, 2010, entitled BATTERY TESTER FOR ELECTRIC VEHICLE; U.S. Ser. No. 12/894,951, filed Sep. 30, 2010, entitled BATTERY PACK MAINTENANCE FOR ELECTRIC VEHICLES; U.S. Ser. No. 61/411,162, filed Nov. 8, 2010, entitled ELECTRONIC BATTERY TESTER; U.S. Ser. No. 13/037,641, filed Mar. 1, 2011, entitled MONITOR FOR FRONT TERMINAL BATTERIES; U.S. Ser. No. 13/037,641, filed Mar. 1, 2011, entitled: MONITOR FOR FRONT TERMINAL BATTERIES; U.S. Ser. No. 13/048,365, filed Mar. 15, 2011, entitled ELECTRONIC BATTERY TESTER WITH BATTERY AGE UNIT; U.S. Ser. No. 13/098,661, filed May 2, 2011, entitled METHOD AND APPARATUS FOR MEASURING A PARAMETER OF A VEHICLE ELECTRICAL SYSTEM; U.S. Ser. No. 13/113,272, filed May 23, 2011, entitled ELECTRONIC STORAGE BATTERY DIAGNOSTIC SYSTEM; U.S. Ser. No. 13/152,711, filed Jun. 3, 2011, entitled BATTERY PACK MAINTENANCE FOR ELECTRIC VEHICLE; U.S. Ser. No. 13/205,949, filed Aug. 9, 2011, entitled ELECTRONIC BATTERY TESTER FOR TESTING STORAGE BATTERY; U.S. Ser. No. 13/205,904, filed Aug. 9, 2011, entitled IN-VEHICLE BATTERY MONITOR; which are incorporated herein by reference in their entirety.

There is an ongoing need to measure parameters of electrical systems of vehicles and heavy equipment. Such measurements can be used to diagnose operation, failure or impending failure of components or subsystems of electrical systems. For example, in electrical systems used in vehicles, measurement of electrical parameters of such systems can be used to diagnose operation of system or indicate that maintenance is required before ultimate failure.

One particular measurement is the resistance of cabling used in large equipment such as heavy trucks. For example, one such cable or set of cables connects the battery of vehicle to the starter motor. The starter motor has a relatively large current draw and even a relatively small cable resistance can have a significant impact on operation of the starter motor.

Because the cable resistance is relatively small it typically cannot be measured using a standard ohm meter or other techniques which are normally used to measure resistance. One technique which has been used to measure the cable resistance is to run a very large current through the cable and measure the voltage drop. However, this is cumbersome and requires components capable of handling the large current.

SUMMARY OF THE INVENTION

An apparatus for measuring electrical parameters for an electrical system includes measurement circuitry which is configured to measure a first parameter of the electrical system between a first connection to the electrical system and a second connection to the electrical system. The measurement circuitry is further configured to measure a second parameter of the electrical system between a third connection to the electrical system and the second connection to the electrical system. A processor determines a third electrical parameter of the electrical system as a function of the first parameter and the second parameter. Wireless communication is provided between components of the apparatus. A method can also be employed.

DETAILED DESCRIPTION OF THE PREFERRED EMBODIMENTS

Figure 1:
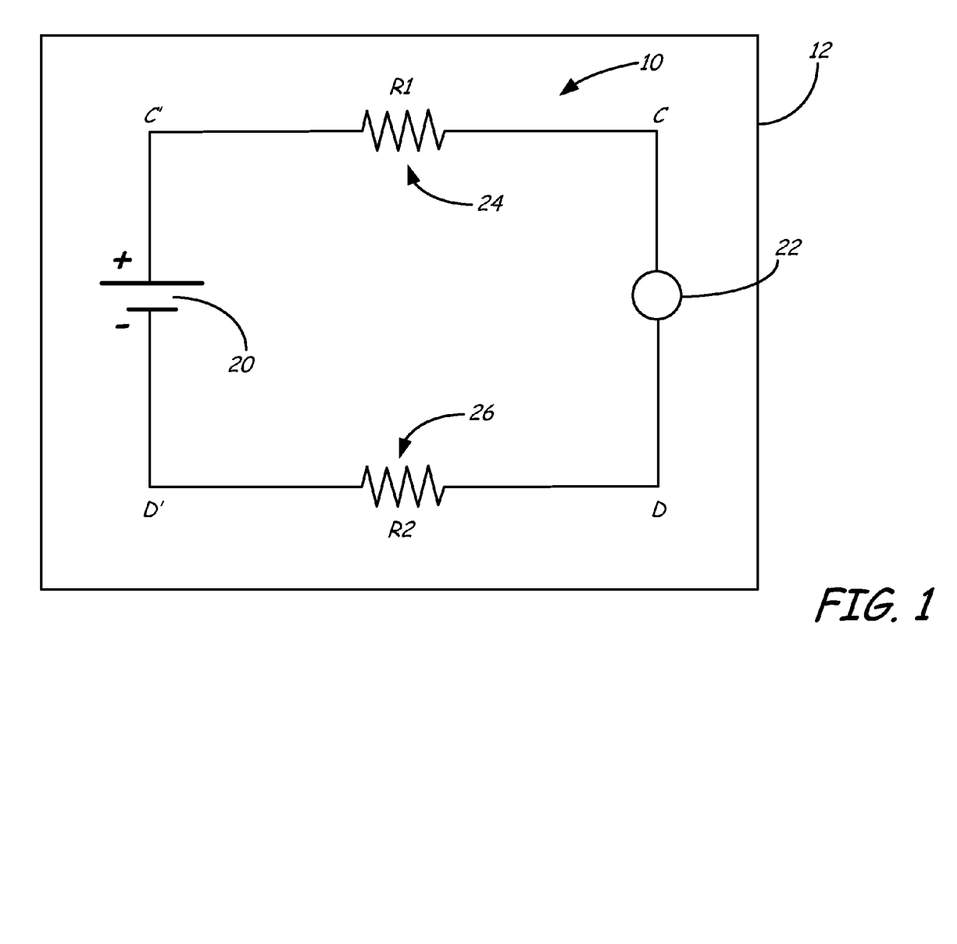
FIG. 1 is a simplified diagram of an electrical system of a vehicle.

FIG. 1 is a diagram of an electrical system 10 of large equipment 12 such as a heavy truck. Electrical system 10 includes a battery 20, a high current load 22 and cables 24 and 26. Cables 24 and 26 have resistances $R_1$ and $R_2$, respectively and connect load 22 to battery 20. FIG. 1 also shows connection points C, D and C', D'. Connections C and D are cross load 22 and connections C' and D' are cross battery 20.

As discussed in the Background section, the resistances $R_1$ and $R_2$ of cables 24 and 26 can have a significant impact on the amount of power which can be delivered to load 22. Even if the resistance values are relatively small, because a relatively large current passes through cables 24 and 26, the resultant voltage drop can significantly reduce the voltage at points C and D and therefore the amount of power (or voltage) which can be delivered to load 22. In industrial equipment, it is often desirable to measure the resistance $R_1$ and $R_2$ of cables 24 and 26, respectively, in order to identify a cable with a resistance which is too high. One technique which has been used to measure the resistance of the cables is to pass a large current through the cable and measure the resulting voltage drop across the cable. However, this is a cumbersome test and requires electrical test equipment which is capable of handling the large current draw. The present invention provides an apparatus and technique for measuring the resistance of a cable in a configuration similar to that shown in FIG. 1.

Figure 2:
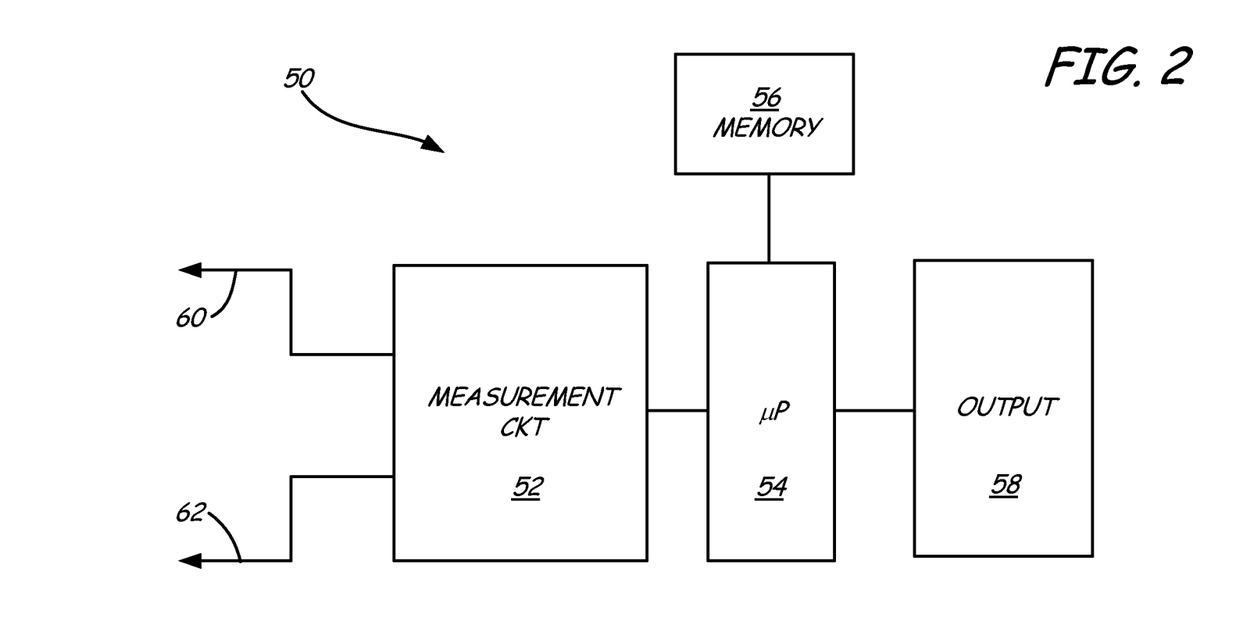
FIG. 2 is a diagram showing test equipment for determining the resistance of cables of the electrical system shown in FIG. 1.

FIG. 2 is a simplified block diagram of one example embodiment of electrical test equipment 50 for measuring electrical parameters of the electrical system 10 shown in FIG. 1. Test equipment 50 includes measurement circuitry 52, microprocessor 54, memory 56 and output 58. Measurement circuitry 52 is configured to couple to electrical system 10 of FIG. 1 through electrical connections 60 and 62. Measurements obtained by measurement circuitry 52 are used by microprocessor 54 in accordance with program instructions contained in memory 56. Based upon the measurements, an output is provided through output 58, for example, to a user or to other equipment. Connectors 60 and 62 are configured to couple to points C, D and C', D' in order to measure parameters of system 10. Any number of connectors may be used and the invention is not limited to the two illustrated in FIG. 2.

In one aspect of the present invention, test equipment 50 measures a parameter P(C, D') between points C and D' and a parameter P(C', D') between points C' and D'. These measurements are used to determine the resistance of $R_1$ in accordance with the formula:

$$R_1 = F[P(C, D'), P(C', D')] \quad \text{EQ. 1}$$

Further, a third measurement can be taken to obtain a parameter P(C',D) between points C' and D in FIG. 1. With this additional parameter, the resistance of $R_2$ can be determined as:

$$R_2 = F[P(C', D), P(C', D')] \quad \text{EQ. 2}$$

Microprocessor 54 can determine the actual values of $R_1$ and $R_2$, or can make some other determination related to $R_1$ and $R_2$, for example a pass/fail determination, a relative determination, a gradient based determination, etc. Microprocessor 54 provides an output through output 58 based upon the determination related to $R_1$ and $R_2$. The output can be a visual output, audible output, or the like, to an operator. In another example, the output is suitable for receipt by other circuitry.

Figure 3:
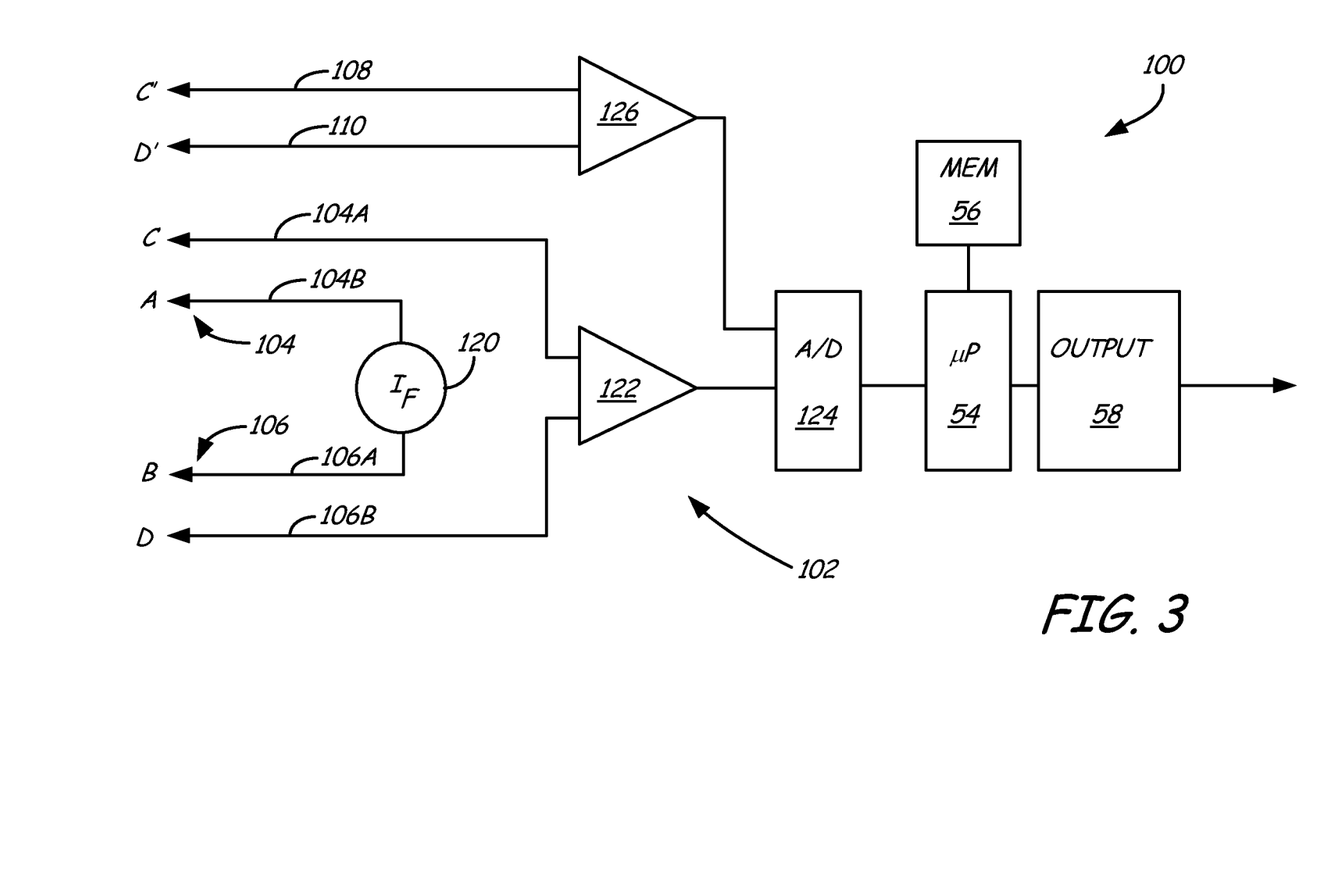
FIG. 3 shows another example embodiment of test equipment for determining cable resistance.

FIG. 3 is a simplified diagram showing another example embodiment of circuitry in accordance with the present invention. In FIG. 3, test equipment 100 includes a microprocessor 54, memory 56 and output 58, similar to the configuration discussed with respect to FIG. 2. Additionally, measurement circuitry 102 is provided for coupling to the C, D and C', D' connections shown in FIG. 1. More specifically, Kelvin connections 104 and 106 are provided and are identified as A, B, C and D with connections 104B, 106A, 104A and 106B, respectively. Kelvin connection 104 is configured to couple to location C shown in FIG. 1. Kelvin connection 106 is configured to couple to location D shown in FIG. 1. An additional pair of connections 108 and 110 are configured to couple to locations C' and D' shown in FIG. 1. A forcing function 120 couples to connections 104B and 106A (A and B) and is configured to apply a time varying signal therebetween. The signal can be any type of time varying signal including a periodic signal and may have any type of waveform at a desired frequency or multiple frequencies. Further, in some embodiments, measurements are taken using different forcing functions at differing frequencies or waveforms. The forcing function can be an active signal which is injected through the A/B connection, or can be a passive signal in which a signal is drawn from points A/B through selective application of a resistance, etc.

An amplifier 122 couples to connections 104A and 106B (C and D) and provides an output to an analog to digital converter 124. Connections 108 and 110 (C' and D') couple to an amplifier 126 which provides an output to analog to digital converter 124. Note that this configuration is for explanation only and other configurations can be implemented in accordance with the present invention including different amplifier configurations, different analog to digital converter configurations, etc. Further, the forcing function 120 can be an active forcing function in which a signal is actively applied or can be a passive forcing function in which a signal is applied passively through a resistance or the like which is selectively applied to draw current from battery 20 shown in FIG. 1. The circuitry can be implemented in analog or digital circuitry, or their combination. Circuitry in accordance with techniques set forth in the Background section can be implemented, or other measurement techniques can be used.

Using the configuration set forth in FIG. 3, Kelvin connections 104 and 106 can be applied to points C and D identified in FIG. 1. Additional connections 108 and 110 can be applied to points C' and D' shown in FIG. 1. Using this configuration, the parameters measured in accordance with FIGS. 1 and 2 can be dynamic parameters which are functions of the applied forcing function 120. In another example embodiment, a single pair of Kelvin connections is used in which the connections are moved between various positions C, D, C' and D' shown in FIG. 1 and the resistance $R_1$ and $R_2$ of the cables 24 and 26 are determined.

Using the circuitry set forth in FIG. 3, conductance values between the various connections shown in FIG. 1 can be obtained. Using these conductance values, the resistances $R_1$ and $R_2$ can be determined using the following equations:

$$R_1 = (K_1/G_{CD'}) - (K_2/G_{C'D'}) \qquad \text{EQ. 3}$$

$$R_2 = (K_3/G_{C'D}) - (K_4/G_{C'D'}) \qquad \text{EQ. 4}$$

Where $G_{CD'}$ is the conductance measured between points C and D', $G_{C'D}$ is the conductance measured between points C' and D' and $G_{C'D'}$ is the conductance measured between points C' and D. The values $K_1$, $K_2$, $K_3$ and $K_4$ are constants and can be, in some examples, the same value, for example unity. The conductance values can be either direct conductance values or can be conductance values converted to a cold cranking amps (CCA) scale. When CCA values are measured, the values of $R_1$ and $R_2$ can be determined using the formula:

$$R_1 = (3.125/CCA\_CD') - (3.125/CCA\_C'D') \qquad \text{EQ. 5}$$

$$R_2 = (3.125/CCA\_C'D) - (3.125/CCA\_C'D') \qquad \text{EQ. 6}$$

The value of 3.125 can be adjusted based upon the particular CCA scale employed.

The load 22 can be any type of load including loads which draw high current levels, for example, a starter motor, a magnetic switch, a ground connection, wiring harness, a terminal which may be susceptible to corrosion, a connection through a bolt which may have inappropriate torque or otherwise provide a poor connection, trailer wiring, etc. In one example output, a particular voltage drop is provided for a particular current draw through the cabling. For example, the output can comprise an indication that there is a 0.5 volt drop through the cable under a 500 amp current. Such a parameter can also be used, for example, in a pass/fail test, i.e., if the voltage drop is more than a particular threshold at a given current level, a failure indication can be provided as an output. In one embodiment, the measured parameters comprise dynamic conductance. However, any dynamic parameter can be used in accordance with the present invention including dynamic resistance, reactance, impedance, conductance, susceptance, and/or admittance, including any combination of these parameters.

Figure 4:
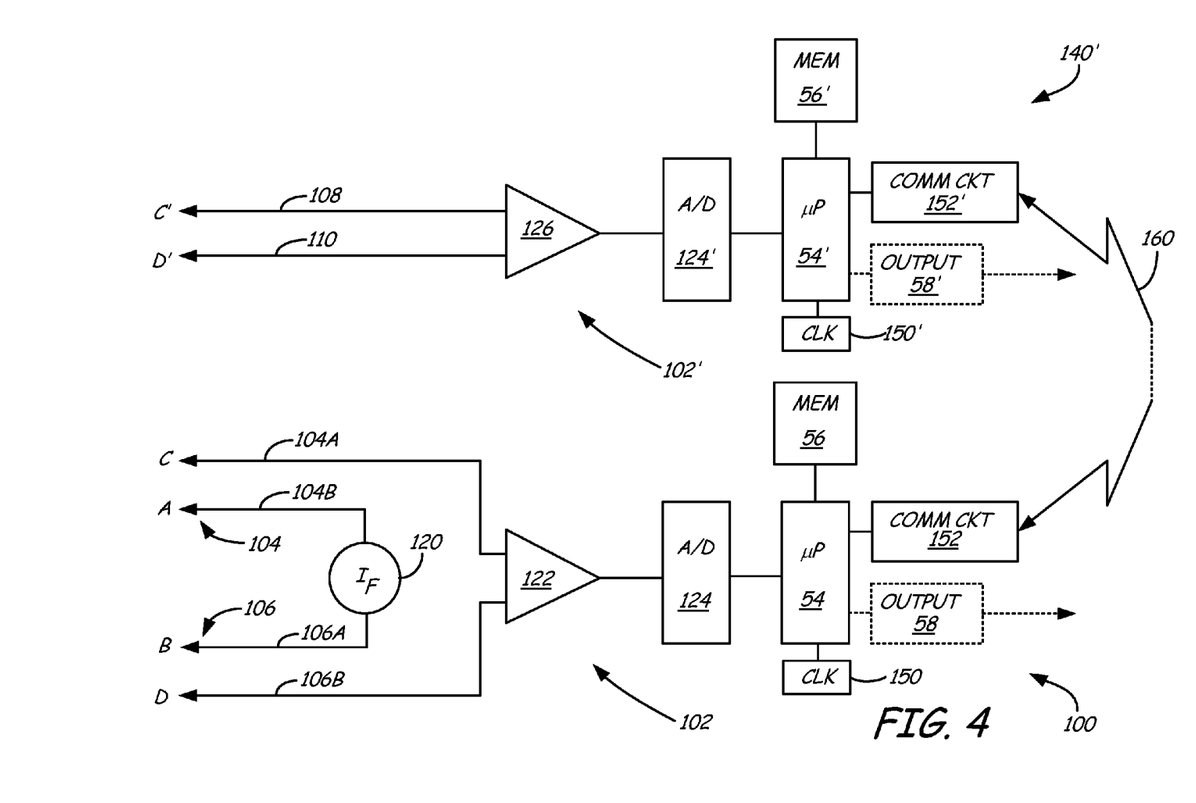
FIG. 4 is a block diagram showing another example embodiment of test circuitry of the present invention.

FIG. 4 is a simplified block diagram showing another example embodiment of circuitry in accordance with the present invention. In FIG. 4, the test equipment 100 is divided into modules 140 and 140'. In this configuration, module 140 includes the forcing function 120 as discussed above. Module 140' include elements similar to those shown in connection with FIG. 3 the numbering has been retained accordingly. Further, module 140' includes an analog to digital converter 124', microprocessor 54', memory 56' and output 58'. These elements are similar to those described in connection with FIG. 3 and shown in module 140 of FIG. 4. Additionally, modules 140 and 140' include a clock 150, 150' and communication circuitry 152, 152', respectively.

In the configuration of FIG. 4, modules 140 and 140' may be spaced apart and communicate over a wireless communication link 160. In the configuration of FIG. 4, the module 140 and 140' may be spaced apart in the vehicle without requiring a separate physical connection. In such a configuration, the modules may include individual power supplies, or, may receive power from the vehicle under test. The modules include optional output circuits 58 and 58' whereby an output may be provided to an operator or other electronic circuitry. This configuration allows data collected at one of the modules to be provided to the other module whereby the above described computations may be performed. Thus, depending upon which of the modules 140, 140' performs the computations, that particular module may include a more advanced microprocessor 54, 54' as required. Similarly, if a module is performing little or no computations, a much simpler configuration can be used and may not require a complete microprocessor system.

When the small forcing function or test signals described above are sent over long cables, detection and measurements can be difficult. This is because of noise in the electrical system as well as difficulty in managing long cable runs between the modules. The long cable run problem is alleviated in the configuration of FIG. 4 by the wireless communication link 160. In another aspect, the clock circuits 150 and 150' are synchronized whereby the testing is performed in synchronization between the two modules 140 and 140'. This allows measurements to be obtained in synchronization prior to application of the forcing function (i.e., a load pulse), during application of the forcing function and after application of the forcing function. The cable resistance may be calculated based upon one such measurement cycle or, may be calculated using multiples of such cycles which are used together based upon statistical parameters, for example, an average, etc. Although the measurements may include small errors due to calibrations due to the two independent analog to digital converters, these calibration problems should not significantly alter the measurements because the cable resistance is calculated based upon changes in measured values as opposed to absolute values.

The particular circuitry of communication circuit 152, 152' may be chosen as desired. Examples include a radio frequency communication link including a proprietary link, or standardized communication links such as those based upon Bluetooth® communication technology, Wi-Fi, etc. The synchronization of data can be shared over the wireless communication link 160. The wireless communication link 160 may, based upon device requirements, be bi-direction or uni-directional. In one configuration, circuitry 58 and/or 58' may operate as a user input/output circuitry and include components to receive an input from an operator or from other electronic circuitry and/or display information to a user, send information to another device, etc. This allows the device to interact with an operator, for example, instructing the operator on steps required in performing the test, receive parameters from the operator, receiving instructions to begin testing, receive calibration information from the operator, etc. Additionally, multiple modules 140, 140' may be used during testing whereby multiple cables may be tested. The testing of multiple cables may be using a single forcing function, or may be through the application of multiple forcing functions. Additional diagnostic information can be provided to an operator, for example, to indicate that the modules are coupled to the same electrical cable, verify that the electrical connections to the wiring have sufficiently low resistance to provide good test results, etc.

Although the present invention has been described with reference to preferred embodiments, workers skilled in the art will recognize that changes may be made in form and detail without departing from the spirit and scope of the invention. The measurements can be taken using multiple connections to the electrical system or by moving a single pair of connections to various positions on the electrical system. An output can be provided to instruct the operator where to place the connections.

What is claimed is:

1. An apparatus for measuring electrical parameters of an electrical system comprising:
measurement circuitry configured to measure a first parameter of the electrical system between a first connection to the electrical system and a second connection to the electrical system;
the measurement circuitry further configured to measure a second parameter of the electrical system between a third connection to the electrical system and the second connection to the electrical system, the third connection separate from the first connection and the second connection;
a processor configured to determine a third electrical parameter of the electrical system as a function of the first parameter and the second parameter;
the measurement circuitry further configured to measure a fourth parameter between the third electrical connection to the electrical system and a fourth connection to the electrical system, the fourth connection separate from the first connection, the second connection, and the third connection, the processor configured to determine a fifth electrical parameter of the electrical system as a function of the fourth dynamic parameter and the second parameter; and
wireless communication circuitry configured to wirelessly communicate at least one of the first, second, or fourth parameters to the processor.

2. The apparatus of claim 1 wherein the first and second parameters comprise dynamic parameters.

3. The apparatus of claim 1 wherein the first and second parameters are measured in response to a forcing function.

4. The apparatus of claim 3 wherein the forcing function comprises an active forcing function.

5. The apparatus of claim 3 wherein the forcing function comprises a passive forcing function.

6. The apparatus of claim 1 including Kelvin connectors configured to couple to the electrical system.

7. The apparatus of claim 1 wherein the third electrical parameter comprises electrical resistance of a cable of the electrical system.

8. The apparatus of claim 1 wherein the electrical system comprises an electrical system of a vehicle.

9. The apparatus of claim 1 wherein the third electrical parameter comprises electrical resistance and is determined in accordance with the equation:

$$R_1 = F[P(C, D'), P(C', D')]$$

Where C, C' and D' are points on the electrical system.

10. The apparatus of claim 9 including a forcing function applied between the C point on the electrical system and a D point on the electrical system.

11. The apparatus of claim 1 wherein the first and second parameters are indicative of a cold cranking amps (CCA) measurement.

12. The apparatus of claim 1 including an output configured to provide an output related to the third electrical parameter.

13. The apparatus of claim 12 wherein the output comprises an output to an operator.

14. The apparatus of claim 12 wherein the output comprises an output to electrical circuitry.

15. The apparatus of claim 12 wherein the output comprises a pass/fail output.

16. The apparatus of claim 12 wherein the output is indicative of a voltage drop for a particular current through the electrical system.

17. The apparatus of claim 1 wherein the measurement circuitry comprises first and second measurement circuitry, and the first measurement circuitry and the second measurement circuitry are in communication over a wireless communication link.

18. The apparatus of claim 1 wherein the measurement circuitry comprises first and second measurement circuitry, and the first measurement circuitry and the second measurement circuitry operate in synchronization.

19. The apparatus of claim 17 wherein the wireless communication link comprises a radio frequency communication link.

20. A method for measuring electrical parameters of an electrical system comprising:
   measuring a first parameter of the electrical system between a first connection to the electrical system and a second connection to the electrical system;
   measuring a second parameter of the electrical system between a third connection to the electrical system and the second connection to the electrical system, the third connection separate from the first connection and the second connection;
   determining, using a processor, a third parameter of the electrical system as a function of the first parameter and the second parameter;
   measuring a fourth parameter between the third electrical connection to the electrical system and a fourth connection to the electrical system, the fourth connection separate from the first connection, the second connection, and the third connection;
   determining, using the processor; a fifth parameter of the electrical system as a function of the fourth parameter and the second parameter; and
   wirelessly communicating at least one of the first, the second, and the fourth parameters to the processor.

21. The method of claim 20 wherein the first and second parameters comprise dynamic parameters.

22. The method of claim 20 including applying a forcing function and wherein the first and second parameters are measured in response to the forcing function.

23. The method of claim 22 wherein the forcing function comprises an active forcing function.

24. The method of claim 22 wherein the forcing function comprises a passive forcing function.

25. The method of claim 20 including applying Kelvin connectors configured to couple to the electrical system.

26. The method of claim 20 wherein the third electrical parameter comprises electrical resistance of a cable of the electrical system.

27. The method of claim 20 wherein the electrical system comprises an electrical system of a vehicle.

28. The method of claim 20 wherein the third parameter comprises electrical resistance and is determined in accordance with the equation: $R_i = F[P(C, D'), P(C', D')]$ Where C, C' and D' are points on the electrical system.

29. The method of claim 28 including applying a forcing function between the C point on the electrical system and a D point on the electrical system.

30. The method of claim 20 wherein the first and second parameters are indicative of a cold cranking amps (CCA) measurement.

31. The method of claim 20 including providing an output related to the third electrical parameter.

32. The method of claim 31 wherein the output is provided to an operator.

33. The method of claim 31 wherein the output is provided to electrical circuitry.

34. The method of claim 31 wherein the output comprises a pass/fail output.

35. The method of claim 31 wherein the output is indicative of a voltage drop for a particular current through the electrical system.

36. The method of claim 20 including communicating wirelessly between circuitry configured to measure the first parameter and circuitry configured to measure the second parameter.

37. The method of claim 36 wherein the wireless communicating comprises communicating a radio frequency communication link.

38. The method of claim 20 including synchronizing the step of measuring a first parameter and the step of measuring a second parameter.

39. An apparatus for measuring electrical parameters of an electrical system comprising:
   measurement means for:
      measuring a first parameter of the electrical system between a first connection to the electrical system and a second connection to the electrical system;
      measuring a second parameter of the electrical system between a third connection to the electrical system and the second connection to the electrical system, the third connection separate from the first connection and the second connection; and
      measuring a third parameter between the third electrical connection to the electrical system and a fourth connection to the electrical system, the fourth connection separate from the first connection, the second connection, and the third connection;
   processor means for determining a fourth electrical parameter of the electrical system as a function of the first parameter and the second parameter and for determining a fifth parameter of the electrical system as a function of the third parameter and the second parameter; and
   means for wireles sly communicating at least one of the first, second, and third parameters to the process means.

* * * * *